US008564285B2

(12) United States Patent
Romero et al.

(10) Patent No.: US 8,564,285 B2
(45) Date of Patent: Oct. 22, 2013

(54) MAGNETIC FIELD SENSOR WITH IMPROVED DIFFERENTIATION BETWEEN A SENSED MAGNETIC FIELD SIGNAL AND A NOISE SIGNAL

(75) Inventors: Hernan D. Romero, Buenos Aires (AR); Gerardo Monreal, Pilar Buenos Aires (AR)

(73) Assignee: Allegro Microsystems, LLC, Worcester, MA (US)

( * ) Notice: Subject to any disclaimer, the term of this patent is extended or adjusted under 35 U.S.C. 154(b) by 344 days.

(21) Appl. No.: 12/845,115

(22) Filed: Jul. 28, 2010

(65) Prior Publication Data

US 2012/0025817 A1 Feb. 2, 2012

(51) Int. Cl.
G01R 33/06 (2006.01)
(52) U.S. Cl.
USPC .......................................................... 324/251
(58) Field of Classification Search
USPC ................. 324/251, 207.2, 235, 244; 372/20; 329/300; 455/280; 331/4
See application file for complete search history.

(56) References Cited

U.S. PATENT DOCUMENTS

| | | | | |
|---|---|---|---|---|
| 4,065,722 A | * | 12/1977 | Francis | 329/300 |
| 4,513,256 A | * | 4/1985 | Kurihara et al. | 331/4 |
| 4,603,305 A | * | 7/1986 | McCune | 331/4 |
| 4,626,855 A | | 12/1986 | Rouse | |
| 5,023,571 A | | 6/1991 | Fullmer et al. | |
| 5,115,202 A | | 5/1992 | Brown | |
| 5,334,944 A | * | 8/1994 | Hirakata | 330/6 |
| 5,581,582 A | * | 12/1996 | Choi | 375/344 |
| 5,621,319 A | | 4/1997 | Bilotti et al. | |
| 5,751,747 A | * | 5/1998 | Lutes et al. | 372/20 |
| 6,130,578 A | | 10/2000 | Tang | |
| 6,201,835 B1 | | 3/2001 | Wang | |
| 6,833,693 B2 | | 12/2004 | Andrews | |
| 7,425,821 B2 | | 9/2008 | Monreal et al. | |
| 7,453,372 B2 | | 11/2008 | Hentati et al. | |
| 7,605,647 B1 | | 10/2009 | Romero | |
| 2003/0102908 A1 | * | 6/2003 | Ausserlechner et al. | 330/9 |
| 2007/0129041 A1 | * | 6/2007 | Yokoyama et al. | 455/280 |
| 2008/0094055 A1 | * | 4/2008 | Monreal et al. | 324/117 H |
| 2009/0261821 A1 | | 10/2009 | Motz | |
| 2013/0093412 A1 | | 4/2013 | Anelli et al. | |

OTHER PUBLICATIONS

Demierre, M., "Contactless 360 absolute angular CMOS microsystem based on vertical Hall sensors", Mar. 18, 2004, Elseiver, p. 39-44.*
Niman, M., "Advanced Course Transmitters: Part—Mixers & Modulation", Apr. 20, 2009, CARS, slides 1-13.*
Makinwa, K., "T4: Dynamic Offset-Cancellation Techniques in CMOS", ISSCC 2007, Feb. 11, 2007, slides 23, 32, and 50.*

(Continued)

Primary Examiner — Arleen M Vazquez
Assistant Examiner — Giovanni Astacio-Oquendo
(74) Attorney, Agent, or Firm — Daly, Crowley, Mofford & Durkee, LLP

(57) ABSTRACT

A magnetic field sensor includes a Hall element configured to generate a Hall element output signal in response to a magnetic field, the Hall element output signal comprising a magnetic field signal component and an offset signal component. The magnetic field sensor also includes a Hall element modulation circuit coupled to receive the Hall element output signal and configured to generate a modulation circuit output signal. The Hall element modulation circuit is modulated with a modulation signal having a changing modulation frequency that changes between a minimum frequency and a maximum frequency.

45 Claims, 13 Drawing Sheets

(56) References Cited

OTHER PUBLICATIONS

MT-090 Tutorial, Analog Devices, http://www.analog.com/static/imported-files/tutorials/MT-090.pdf, pp. 1-21, Rev. Oct. 2008.*
Chen et al.; "A Low-Offset Low-Noise Sigma-Delta Modulator with Pseudorandom Chopper-Stabilization Technique;" IEEE Transactions on Circuits and Systems-1: Regular Papers; vol. 56, No. 12; Dec. 2009; pp. 2533-2543.
Godoy et al.; "Chopper Stabilization of Analog Multipliers, Variable Gain Amplifiers, and Mixers;" IEEE Journal of Solid-State Circuits; vol. 43, No. 10; Oct. 2008; pp. 2311-2321.
Bakker et al.; "A CMOS-Nested-Chopper Instrumentation Amplifier with 100-nV Offset;" IEEE Journal of Solid-State Circuits, vol. 35, No. 12; Dec. 2000; pp. 1877-1883.
PCT Search Report and Written Opinion of ISA; dated Aug. 31, 2011; for PCT Pat. App. No. PCT/US2011/039394; 12 pages.
PCT International Preliminary Report on Patentability and Written Opinion of the ISA, dated Feb. 7, 2013; for PCT Pat. App. No. PCT/US2011/039394; 9 pages.
National Instruments; "Continuous Frequency Sweep (Sound and Vibration)," inet: http://zone.ni.com/reference/en-XX/help/372416F-01/svtconcepts/svcontsweep/; Apr. 4, 2012; 3 sheets.

* cited by examiner

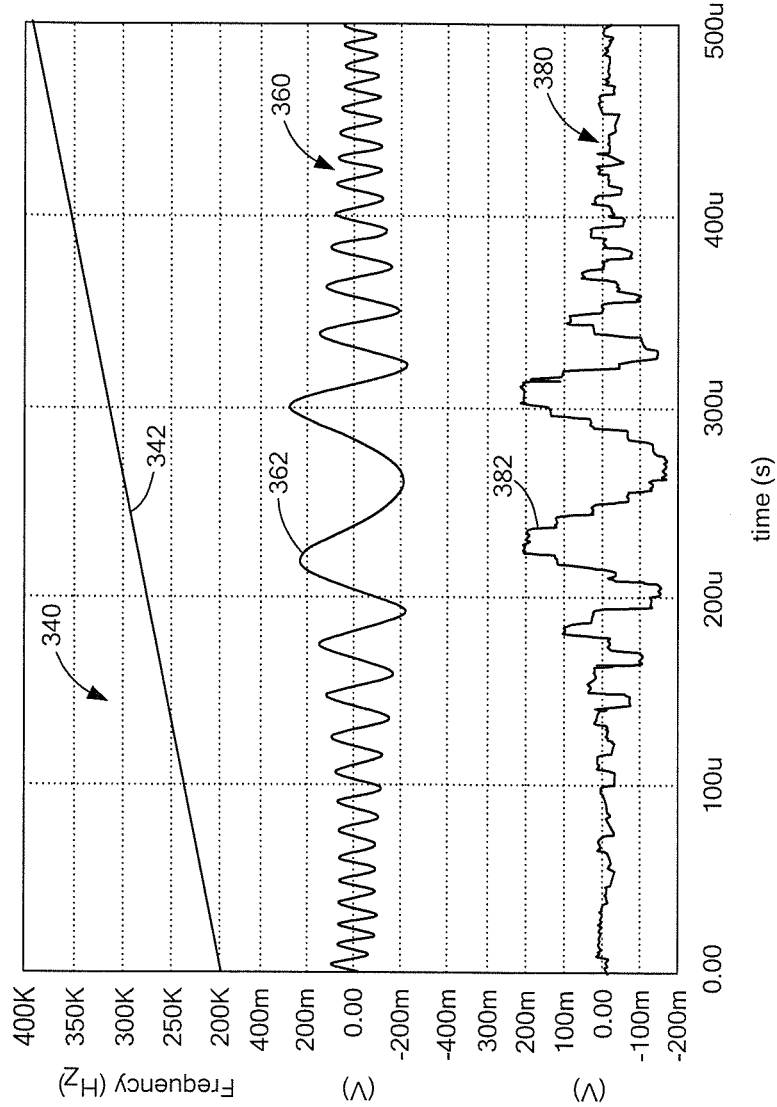

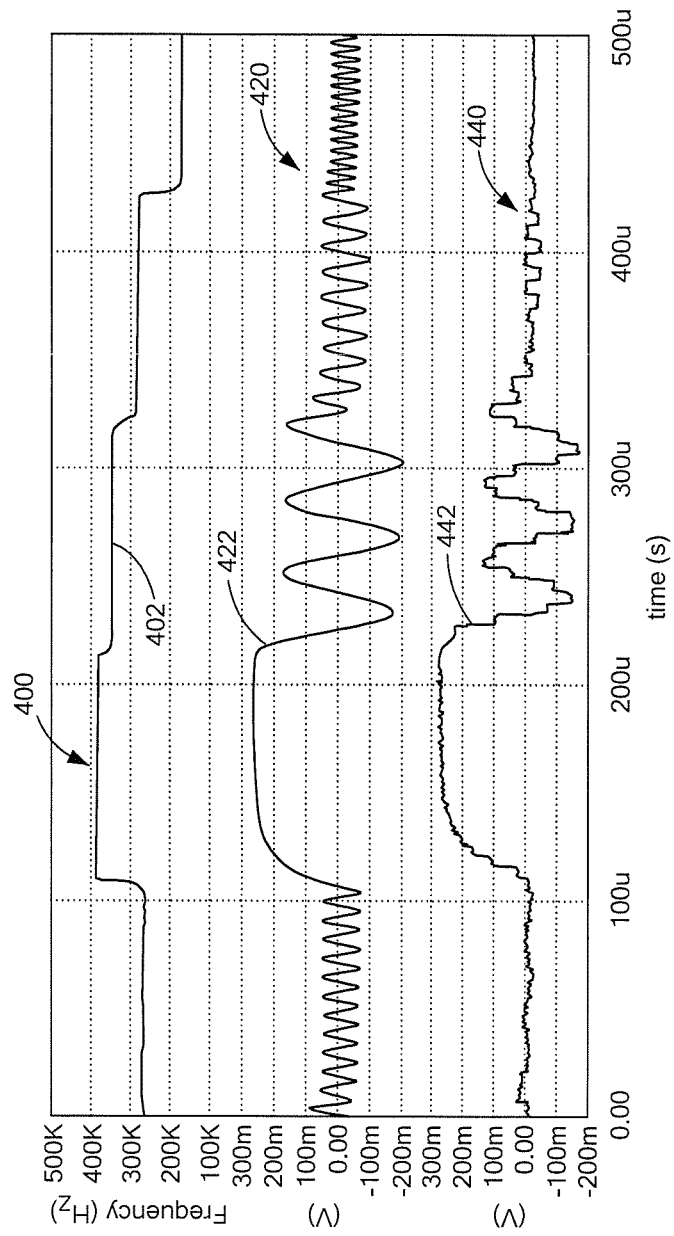

MAGNETIC FIELD SENSOR WITH IMPROVED DIFFERENTIATION BETWEEN A SENSED MAGNETIC FIELD SIGNAL AND A NOISE SIGNAL

CROSS REFERENCE TO RELATED APPLICATIONS

Not Applicable.

STATEMENT REGARDING FEDERALLY SPONSORED RESEARCH

Not Applicable

FIELD OF THE INVENTION

This invention relates generally to magnetic field sensors and, more particularly, to a magnetic field sensor configured to reduce the influence of noise.

BACKGROUND OF THE INVENTION

Magnetic field sensors for detecting magnetic fields are known. In a magnetic field sensor, the magnetic field is detected by a magnetic field sensing element, such as a Hall element or a magnetoresistance element, which provides a signal (i.e., a magnetic field signal) proportional to a detected magnetic field. In some arrangements, the magnetic field signal is an electrical signal.

Magnetic field sensors are used in a variety of applications, including, but not limited to, a linear magnetic field sensor that senses a magnetic field density of a magnetic field, a current sensor that senses a magnetic field generated by a current flowing in a current carrying conductor, a magnetic switch that senses the proximity of a ferromagnetic object, and a rotation detector that senses passing ferromagnetic articles.

For a linear magnetic field sensor, the output signal changes in direct proportion to the sensed magnetic field. For a magnetic switch, the output signal changes state in response to the sensed magnetic field.

Magnetic field sensors are subject to noise, which tends to degrade the accuracy of the magnetic field sensors. The noise can come from a variety of noise sources, including, but not limited to, sources of external magnetic noise fields and sources of external electric noise fields.

It would be desirable to have a magnetic field sensor for which the noise can be distinguished (discriminated) from a desired magnetic field signal.

SUMMARY OF THE INVENTION

The present invention provides a magnetic field sensor with modulation clock signals that change frequency with time, resulting in a magnetic field sensor output signal that provides an ability to better discriminate a noise signal from a magnetic field signal in the magnetic field sensor output signal.

In accordance with one aspect of the present invention, a magnetic field sensor includes a Hall element configured to generate a Hall element output signal in response to a magnetic field, the Hall element output signal comprising a magnetic field signal component and an offset signal component. The magnetic field sensor also includes a Hall element modulation circuit coupled to receive the Hall element output signal and configured to generate a modulation circuit output signal. The Hall element modulation circuit is operable to modulate the magnetic signal component or the offset signal component with a modulation signal having a changing modulation frequency that changes between a minimum frequency and a maximum frequency.

BRIEF DESCRIPTION OF THE DRAWINGS

The foregoing features of the invention, as well as the invention itself may be more fully understood from the following detailed description of the drawings, in which:

FIG. 9 is a time domain graph showing an exemplary modulating clock signal of FIGS. 5 and 5A having a linearly varying frequency;

FIG. 9A is a time domain graph showing an output signal as may be generated at the point C of FIG. 5 in the presence of a noise signal and in response to the modulating clock signal having the linearly varying frequency represented in FIG. 9;

FIG. 9B is a time domain graph showing an output signal as may be generated at the output of the filter circuit of FIGS. 5 and 5A in the presence of the noise signal and in response to the modulating clock signal having the linearly varying frequency as represented in FIG. 9;

FIG. 10 is a time domain graph showing an exemplary modulating clock signal of FIGS. 5 and 5A having frequency steps;

FIG. 10A is a time domain graph showing an output signal as may be generated at the point C of FIG. 5 in the presence of a noise signal and in response to the modulating clock signal having the discrete frequency steps as represented in FIG. 10; and FIG. 10B is a time domain graph showing an output signal as may be generated at the output of the filter circuit of FIGS. 5 and 5A in the presence of the noise signal and in response to the modulating clock signal having the discrete frequency steps as represented in FIG. 10.

DETAILED DESCRIPTION OF THE INVENTION

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall elements, magnetoresistance elements, or magnetotransistors. As is known, there are different types of Hall elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall effect elements (Hall elements) are used in examples herein.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. As described above, magnetic field sensors are used in a variety of applications, including, but not limited to, a linear magnetic field sensor that senses a magnetic field density of a magnetic field, a current sensor that senses a magnetic field generated by a current flowing in a current carrying conductor, a magnetic switch that senses the proximity of a ferromagnetic object, and a rotation detector that senses passing ferromagnetic articles.

The circuits and techniques described herein are suitable for all of the above-identified types of magnetic field sensors that use Hall effect elements. However, for simplicity, only examples showing linear magnetic field sensors that sense a magnetic field density of a magnetic field are shown and described herein.

Figure 1:
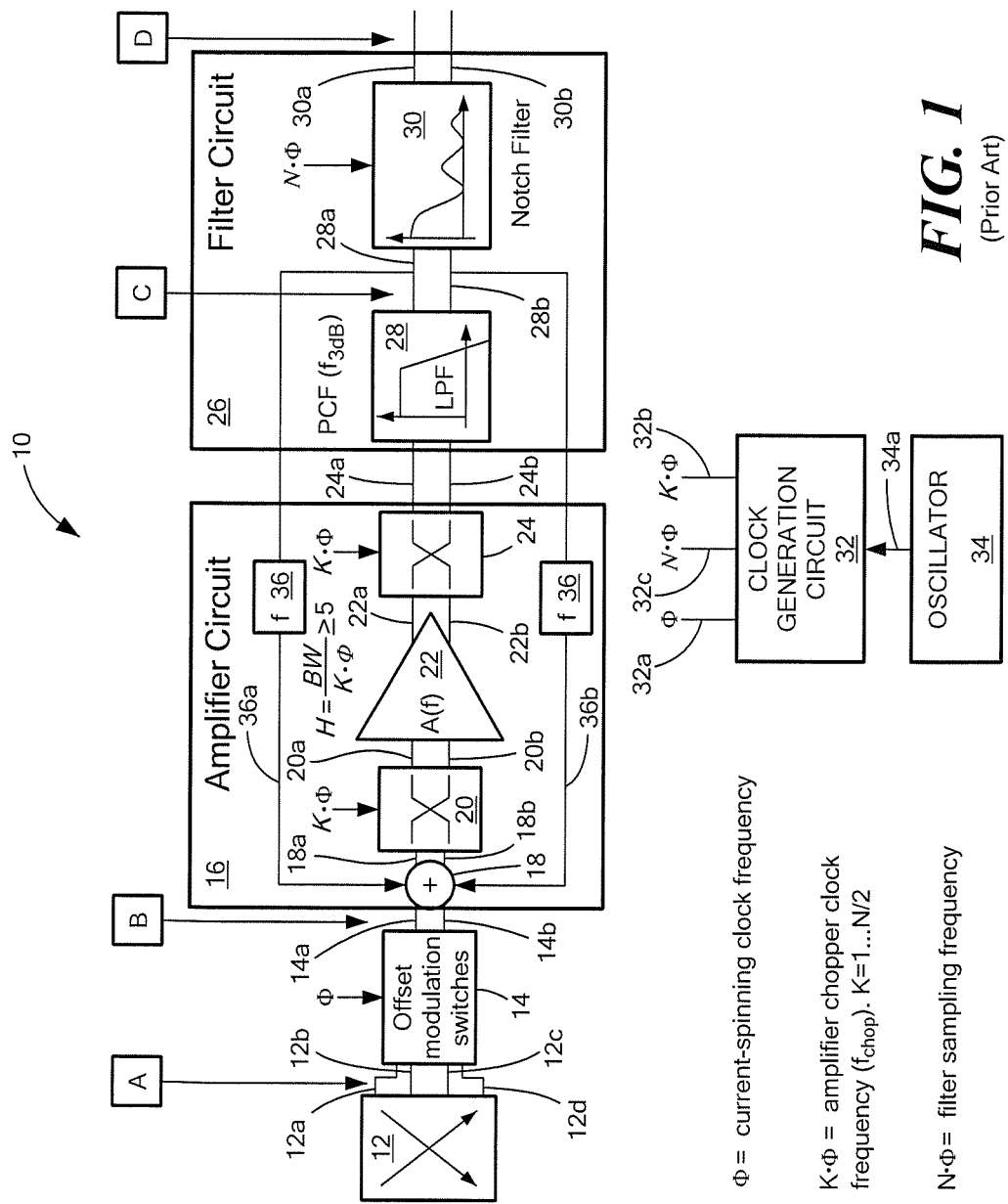
FIG. 1 is block diagram showing a prior art magnetic field sensor having a Hall element, a modulation circuit, an amplifier circuit having a chopper stabilized amplifier, and a filter circuit having an anti-alias filter and a discrete-time selective filter, for which clocked portions are clocked with fixed clocks (i.e., clock signals with fixed frequencies)

Referring to FIG. 1, a prior art magnetic field sensor 10 is of a type described in U.S. Pat. No. 7,425,821, issued Sep. 16, 2008, which is assigned to the assignee of the present invention, and which is incorporated herein by reference in its entirety. The magnetic field sensor 10 includes a Hall element 12 providing four couplings with associated signals 12a-12d to and from a modulation circuit 14. Signals 12a-12d are properly selected by pairs by means of the modulation circuit 14 to form a differential output signal referred to herein as a magnetic field signal. It is described below that the magnetic field signal has at least two components, a magnetic field signal component responsive to a magnetic field and an offset component (generally at DC) not generally responsive to a magnetic field.

The modulation circuit 14 can be of a type described more fully below in conjunction with FIGS. 2-2C or FIGS. 3-3C, but preferably of the type described below in conjunction with FIGS. 2-2C for embodiments in which a first switching circuit 20 is present, and as described below in conjunction with FIGS. 3-3C for embodiments in which the first switching circuit 20 is not used.

The modulation circuit 14 provides a differential output signal 14a, 14b to an amplifier circuit 16 having a chopper-stabilized amplifier described more fully below. The amplifier circuit 16 provides a differential amplified signal 24a, 24b to a filter circuit 26 also described more fully below. The filter circuit 26 can include a low pass filter 28 preceding a discrete-time (time sampling) selective filter. The filter circuit 26 provides a differential output signal 30a, 30b. In some alternate arrangements, the differential signals 24a, 24b, and 30a, 30b can instead be single ended signals.

The differential output signal 30a, 30b can be a linear output signal having a value proportional to a magnetic field sensed by the Hall element 12. In other arrangements, a comparator (not shown) can be coupled to receive the differential output signal 30a, 30b, in which case, and output signal generated by the comparator is a non-linear signal having two states, the two states representative of the magnetic field signal sensed by the Hall element 12 being above or below a threshold.

The amplifier circuit 16 can include a summing node 18 coupled to receive the differential signal 14a, 14b and also a differential feedback signal 36a, 36b. The summing node 18 is configured to generate a differential signal 18a, 18b. The first switching circuit 20 is coupled to receive the differential signal 18a, 18b and configured to generate a first differential switched signal 20a, 20b. A differential amplifier 22 is coupled to receive the first differential switched signal 20a, 20b and configured to generate a differential amplified signal 22a, 22b. A second switching circuit 24 is coupled to receive the differential amplified signal 22a, 22b and configured to generate a second differential switched signal 24a, 24b. The summing node 18, the first switching circuit 20, the differential amplifier 22, and the second switching circuit 24, taken together, form a chopper-stabilized amplifier. In some arrangements, the summing node 18 is omitted and the differential feedback signal 36a, 36b is not used.

The magnetic field sensor 10 also includes a clock generation circuit 32 coupled to receive a clock signal 34a from an oscillator 34 and configured to provide clock signals 32a, 32b, 32c to the modulation circuit 14, to the amplifier circuit 16, and to the filter circuit 26, respectively. Therefore, in preferred embodiments, switching function of the modulation circuit 14, switching function of the amplifier circuit 16, and switching function of the filter circuit 26 are synchronous.

The modulation circuit 14 can be clocked with the clock signal 32a having a frequency, $\Phi$. The first and second switching circuits 20, 24 can be clocked with the clock signal 32b having a frequency $K\Phi$, where K is an integer times $\frac{1}{2}$. The discrete time selective filter 30 can be clocked with the clock signal 32c having a frequency of $N\Phi$, where N is an integer. In some arrangements $K\Phi=\frac{1}{2}\Phi$ and $N\Phi=\frac{1}{4}\Phi$. The clock signals 32a, 32b, 32c have static frequencies.

As described above, it will be understood that the differential output signal (i.e., a differential signal properly selected from among signals 12a-12d in pairs by means of the modulation circuit 14) can include both a desired magnetic field signal component proportional to a sensed magnetic field and also an undesired offset signal component (i.e., DC). It will become apparent from discussion below in conjunction with FIGS. 2-3A, that, even if the Hall element 12 generates a signal (i.e., the differential signal properly selected from among the signals 12a-12d in pairs by means of the modulation circuit 14) having both a magnetic field signal component and an offset component, the output signal 30a, 30b from the magnetic field sensor 10 has a predominant magnetic field signal component and a comparatively reduced offset component.

It will be understood from discussion below in conjunction with FIGS. 2-2C that, in operation, the modulation circuit 14 modulates (i.e., frequency shifts) the offset component of the Hall element differential signal (i.e., the differential signal properly selected from among the signals 12a-12d in pairs by means of the modulation circuit 14) to a higher frequency, while leaving the magnetic field signal component at baseband (e.g., DC or relatively low frequency). Thus, the magnetic field signal component and the offset component are separated in frequency after operation of the modulation circuit 14.

In operation, the amplifier circuit 16, having the chopper-stabilized amplifier, modulates (with the first switching circuit 20) and demodulates (i.e., frequency shifts) (with the second switching circuit 24), resulting in the magnetic field signal component remaining at baseband (e.g., DC or relatively low frequency). The amplifier circuit also operates to de-modulate (with the first switching circuit 20) and re-modulate (i.e., frequency shift) (with the second switching circuit 24), resulting in the offset component remaining at a higher frequency. Thus, the magnetic field signal component and the offset component remain separated in frequency after operation by the amplifier circuit 16.

The filter circuit 26 reduces a magnitude of the offset component, which appears at the higher frequency. Thus, the differential output signal 30a, 30b, includes the magnetic field signal component at baseband (e.g., DC or relatively low frequency) and a much reduced offset component, which was previously shifted to the higher frequency.

Further discussion of the magnetic field sensor 10 can be found in the above-described U.S. Pat. No. 7,425,821.

Figure 1A:
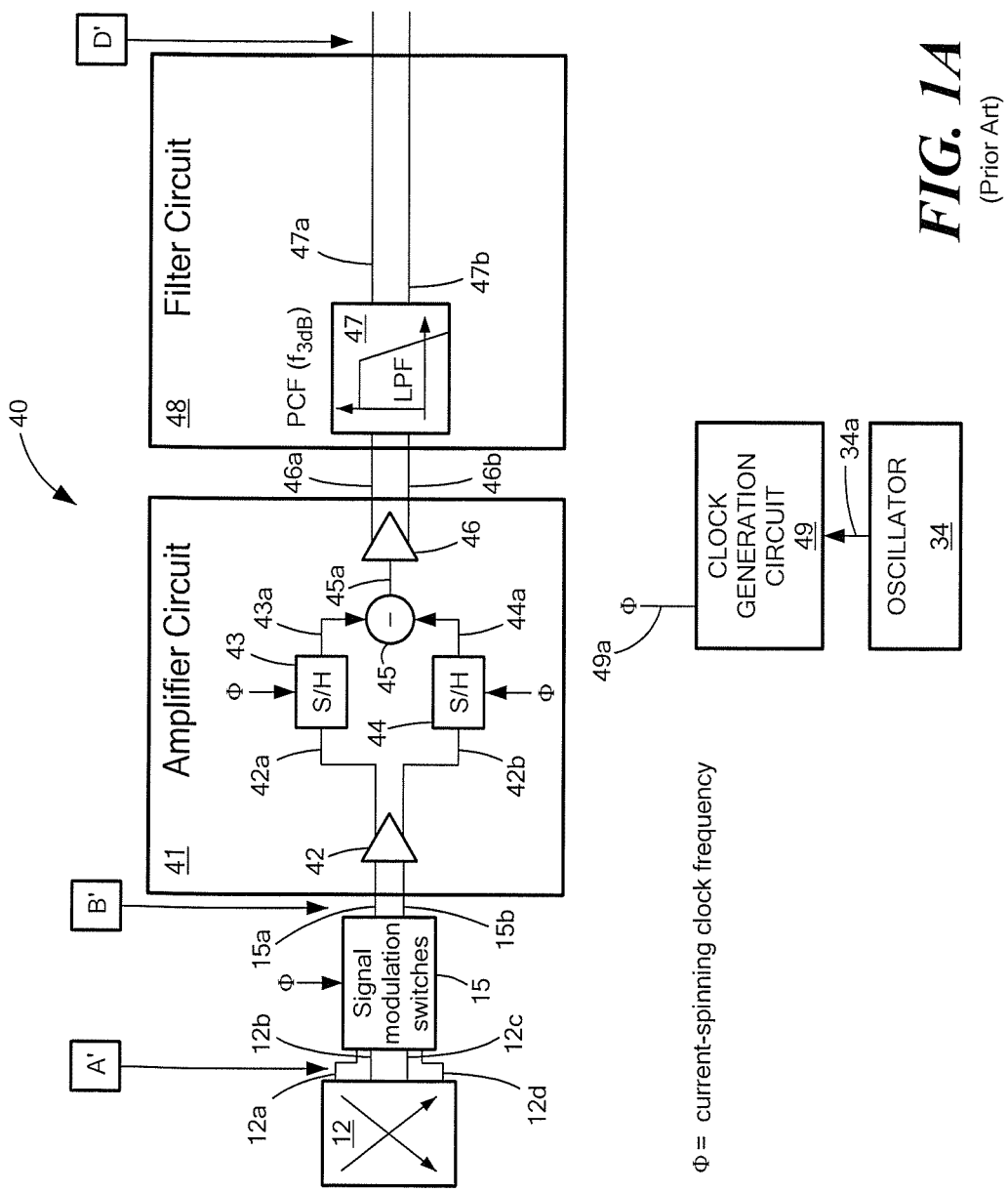
FIG. 1A is a block diagram showing another prior art magnetic field sensor having a Hall element, a modulation circuit, an amplifier circuit having a sample and hold circuit, and a filter circuit having a low pass filter, for which clocked portions are clocked with fixed clocks.

Referring now to FIG. 1A, in which like elements of FIG. 1 are shown having like reference designations, another prior art magnetic field sensor 40 can be of a type described in U.S. Pat. No. 5,621,319, issued Apr. 15, 1997, which is assigned to the assignee of the present invention, and which is incorporated herein by reference in its entirety. The magnetic field sensor 40 includes the Hall element 12 providing the four couplings with associated signals 12a-12d to and from a modulation circuit 15. The modulation circuit 15 can be of a type described more fully below in conjunction with in conjunction with FIGS. 3-3C.

The modulation circuit 15 provides a differential output signal 15a, 15b to an amplifier circuit 41 having two sample and hold circuits 43, 44 described more fully below. The amplifier circuit 41 provides a differential amplified signal 46a, 46b to a filter circuit 48 also described more fully in below. The filter circuit 48 provides a differential output signal 47a, 47b. In some alternate arrangements, the differential signals 46a, 46b and 47a, 47b can be single ended signals.

The amplifier circuit 41 can include a differential amplifier 42 coupled to receive the differential signal 15a, 15b and configured to generate a differential amplified signal 42a, 42b. A first sample and hold circuit 43 is coupled to receive the signal 42a as a single ended signal and a second sample and hold circuit 44 is coupled to receive the signal 42b as a single ended signal. The sample and hold circuit 43 is configured to generate a signal 43a and the sample and hold circuit 44 is configured to generate a signal 44a. A summing node 45 is coupled to receive the signals 43a, 44a and configured to generate a subtracted signal 45a. An amplifier 46 is coupled to receive the subtracted signal 45a and configured to generate the differential signal 46a, 46b.

The filter circuit 48 can include a low pass filter 47 coupled to receive the differential signal 46a, 46b and configured to generate the differential filtered signal 47a, 47b.

The magnetic field sensor 40 also includes a clock generation circuit 49 coupled to receive the clock signal 34a from the oscillator 34 and configured to provide a clock signal 49a to the modulation circuit 12 and to the amplifier circuit 41. In preferred embodiments, switching function of the modulation circuit 15 is synchronous with switching function of the amplifier circuit 41.

The modulation circuit 15 can be clocked with the clock signal 49a having a frequency, $\Phi$. The first and second sample and hold circuits 43, 44 can also be clocked with the clock signal 49a. The clock signal 49a has a static frequency. In some embodiments, the filter circuit 48 is not clocked. In other embodiments, the filter circuit 48 can include a discrete-time selective filter, which can be the same as or similar to the discrete-time selective filter 30 of FIG. 1.

As described above, it will be understood that an output signal (i.e., a differential signal properly selected from among the signals 12a-12d in pairs by means of the modulation circuit 15) from the Hall element 12 can include both a magnetic field signal component proportional to a sensed magnetic field and also an offset signal component. It will become apparent from discussion below in conjunction with FIGS. 3-3C, that, even if the Hall element 12 generates a signal (i.e., the differential signal properly selected from among the signals 12a-12d in pairs by means of the modulation circuit 15) having both a magnetic field signal component and an offset component, the output signal 47a, 47b from the magnetic field sensor 40 has a predominant magnetic field signal component and a greatly reduced offset component.

As also described above, it will be understood from discussion below in conjunction with FIGS. 3 and 3A that, in operation, the modulation circuit 15 modulates (i.e., frequency shifts) the magnetic field signal component of the Hall element differential signal (i.e., the differential signal properly selected from among the signals 12a-12d in pairs by means of the modulation circuit 15) to a higher frequency, while leaving the offset component at baseband (e.g., DC). Thus, the magnetic field signal component and the offset component are separated in frequency by operation of the modulation circuit 15.

The amplifier circuit 41, having the two sample and hold circuits 43, 44, demodulates (i.e., frequency shifts) the magnetic field signal component back to baseband (e.g., DC or low frequency) and modulates (i.e., frequency shifts) the offset component to a higher frequency. Thus, the magnetic field signal component and the offset component remain separated in frequency after operation by the amplifier circuit 41. It will be further understood that the two sample and hold circuits 43, 44 also provide filtering of the resulting signal, similar to that provided by the discrete-time selective filter 30 of FIG. 1. Therefore, the discrete-time selective filter 30 is not required in the magnetic field sensor 40.

The filter circuit 48 can include the low pass filter 47. In operation, the filter circuit 48 can further reduces a magnitude of the offset component, which appears at the higher frequency. The filter circuit 48 can also reduce any second order components resulting from the sampling operation. Thus, the differential output signal 47a, 47b includes the magnetic field signal component at baseband (e.g., DC or low frequency) and a greatly reduced offset component that was previously shifted to the higher frequency.

Figure 2:
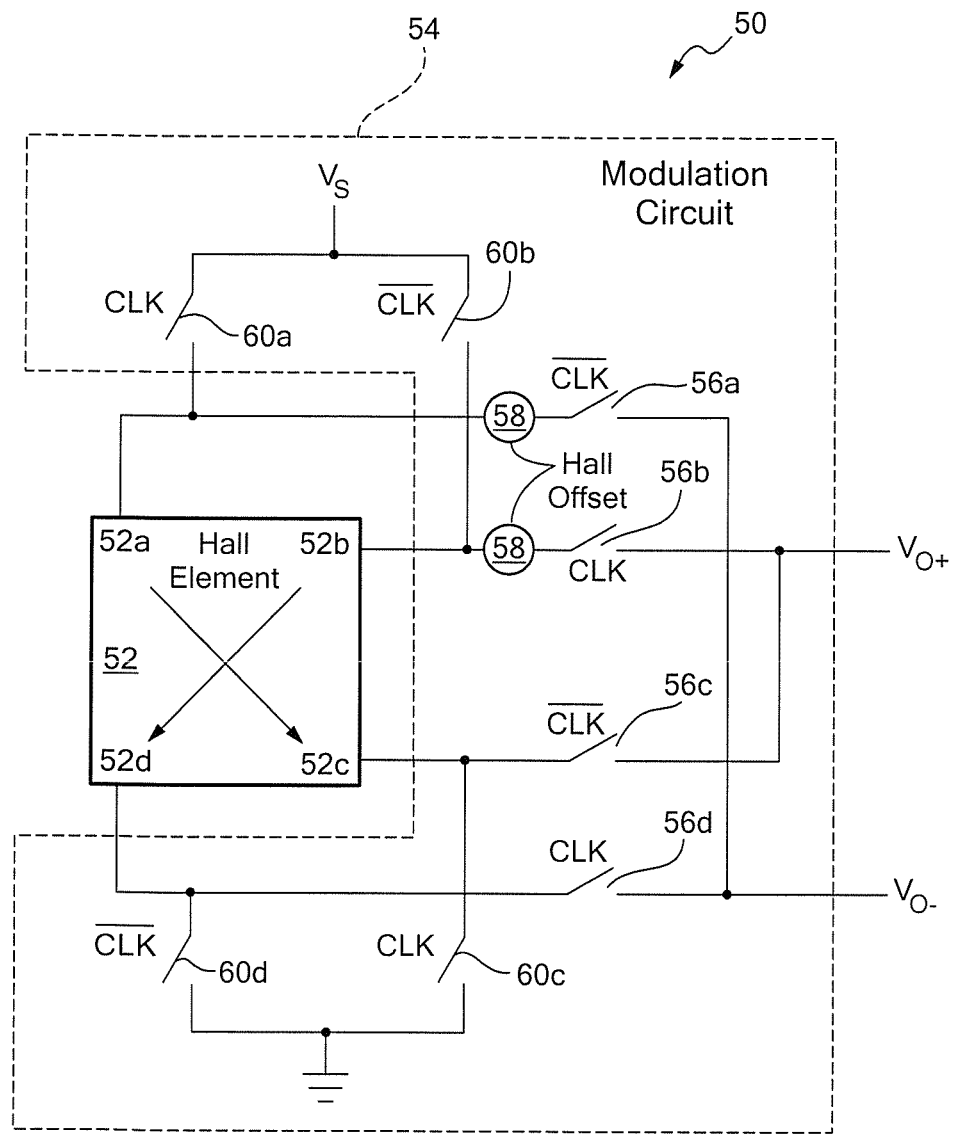
FIG. 2 is a block diagram showing a switched Hall element having a Hall element and having a modulation circuit that can be used as the Hall element and the modulation circuit in the magnetic field sensor of FIGS. 1 and 1A to modulate an offset component to a higher frequency.

Referring now to FIG. 2, a switched Hall element 50, of a type that modulates the Hall offset component, includes a Hall element (or Hall plate) 52 and a modulation circuit 54, which can be the same as or similar to the modulation circuit 14 of FIG. 1. The Hall element 52 includes four contacts 52a, 52b, 52c, and 52d, each coupled to a first terminal of a respective switch 56a, 56b, 56c, and 56d, as shown. Second terminals of switches 56b and 56c are coupled to provide a positive node of a switched Hall output signal, here labeled Vo+, and second terminals of switches 56a and 56d are coupled to provide a negative node of the switched Hall output signal, here labeled Vo−.

Figure 2A:
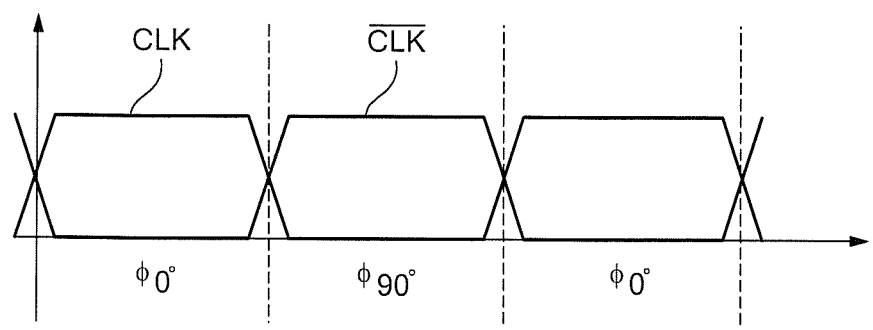
FIG. 2A is a graph showing clock signals for the switched Hall element of FIG. 2.

Additional switches 60a, 60b, 60c, and 60d are arranged to selectively couple the Hall contacts 52a, 52b, 52c, 52d to the supply voltage, Vs, and ground. More particularly, switches 56b, 56d, 60a, and 60c are controlled by a clock signal, CLK, and switches 56a, 56c, 60b, and 60d are controlled by a complementary clock signal, CLK/, as shown. The clock signals CLK and CLK/ have two states or phases, a $\Phi_{0°}$ state and a $\Phi_{90°}$ state, as shown in FIG. 2A.

Figure 2B:
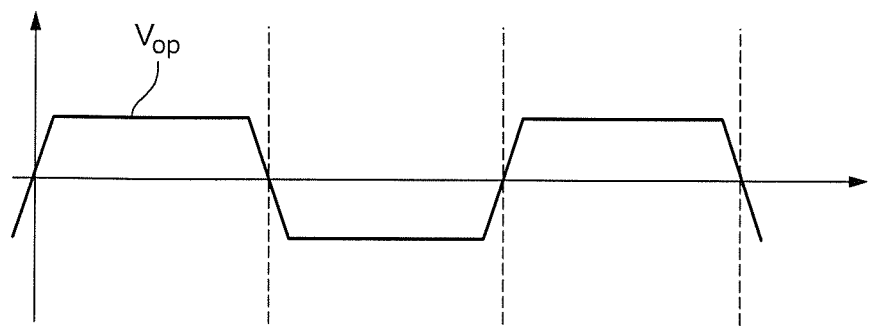
FIG. 2B is a graph showing a modulated offset component provided by the switched Hall element of FIG. 2.
Figure 2C:
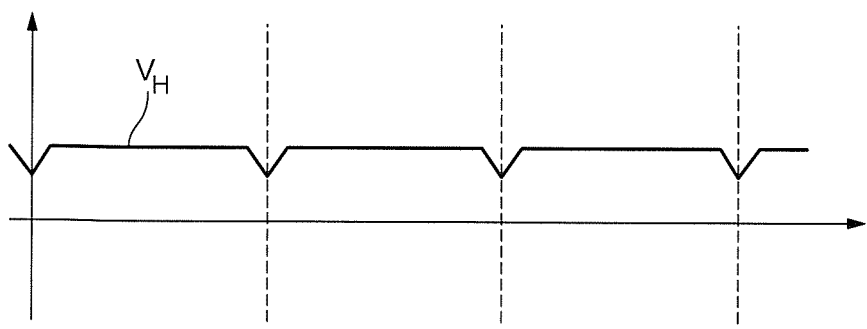
FIG. 2C is a graph showing an un-modulated magnetic field signal component provided by the switched Hall element of FIG. 2.

In operation, during phase $\Phi_{0°}$, current flows from the terminal 52a to the terminal 52c and the switched Hall output signal, Vo, is equal to $V_H+V_{op}$, where $V_{op}$ is the Hall element offset voltage or Hall offset component and $V_H$ is the magnetic filed signal component. During the phase $\Phi_{90°}$, current flows from the terminal 52b to the terminal 52d and the switched Hall output signal, Vo, is equal to $V_H-V_{op}$. Thus, the modulation circuit 54 modulates the Hall offset component, $V_{op}$, which is shown in FIG. 2B for magnetic field other than zero. The magnetic field signal component, $V_H$, remains substantially invariant, as shown in FIG. 2C.

Figure 3:
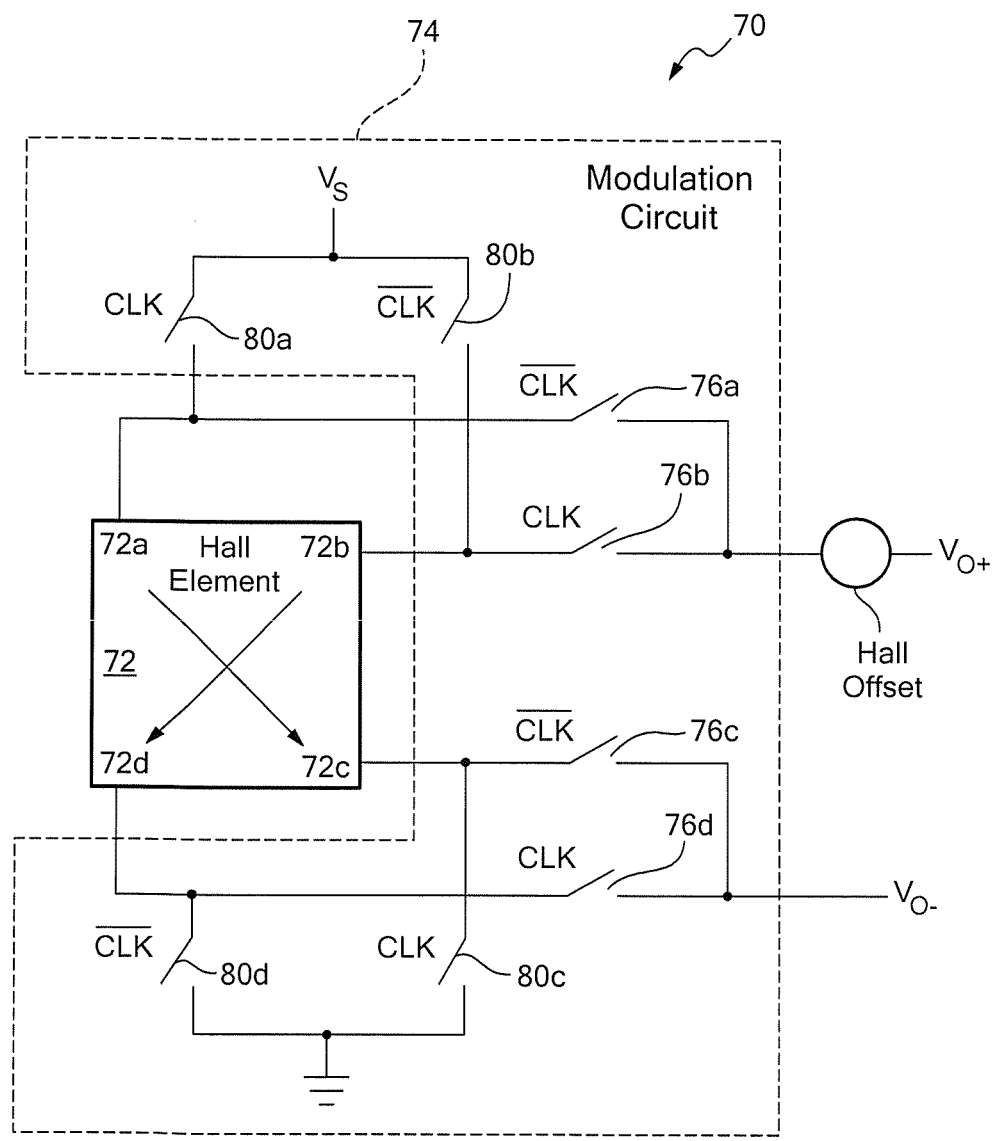
FIG. 3 is a block diagram showing a switched Hall element having a Hall element and having a modulation circuit that can be used as the Hall element and the modulation circuit in the magnetic field sensor of FIGS. 1 and 1A to modulate a magnetic field signal component to a higher frequency.
Figure 3A:
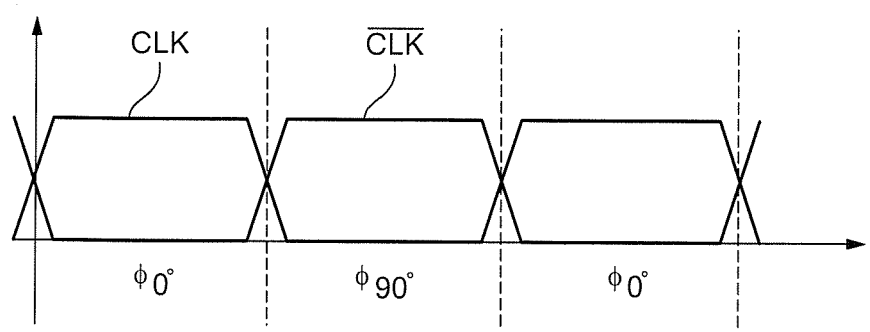
FIG. 3A is a graph showing clock signals for the switched Hall element of FIG. 3.

Referring now to FIG. 3, an alternative switched Hall element 70, of a type that modulates the magnetic signal component, includes a Hall element 72 and a modulation circuit 74, which can be the same as or similar to the modulation circuit 15 of FIG. 1A. The Hall element 72 is the same as the Hall element 52 of FIG. 2 and includes four contacts 72a, 72b, 72c, and 72d, each coupled to a first terminal of a respective switch 76a, 76b, 76c, and 76d. Second terminals of switches 76a and 76b are coupled to provide a positive node of a switched Hall output signal, here labeled Vo+, and second terminals of switches 56c and 56d are coupled to provide a negative node of the switched Hall output signal, here labeled Vo−. Thus, a comparison of FIGS. 2 and 3 reveals that the output contacts of the Hall element are interchanged during the $\Phi_{90°}$ phase.

Additional switches 80a, 80b, 80c, and 80d are arranged to selectively couple the Hall contacts 72a, 72b, 72c, and 72d to the supply voltage Vs and ground. Switches 76b, 76d, 80a, and 80c are controlled by clock signal, CLK, and switches 76a, 76c, 80b, and 80d are controlled by a complementary clock signal, CLK/, as shown. Clock signals, CLK and CLK/, are identical to like signals in FIG. 2 and thus have two states or phases, $\Phi_{0°}$ and $\Phi_{90°}$, as shown.

Figure 3B:
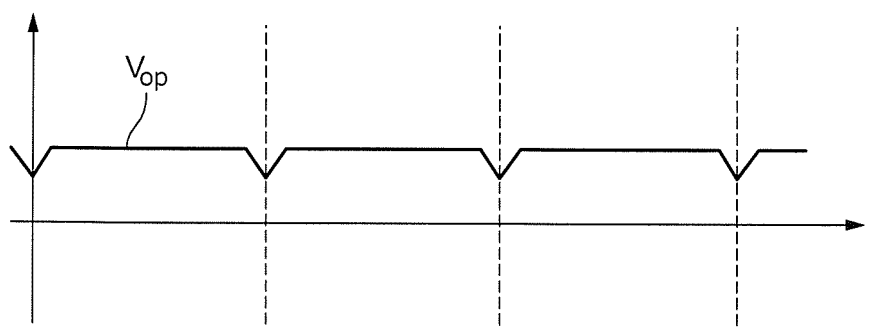
FIG. 3B is a graph showing an un-modulated offset component provided by the switched Hall element of FIG. 3.
Figure 3C:
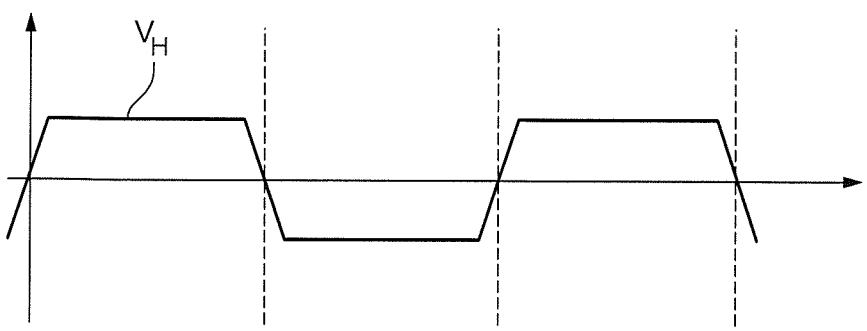
FIG. 3C is a graph showing a modulated magnetic field signal component provided by the switched Hall element of FIG. 3.

In operation, during phase $\Phi_{0°}$, current flows from the terminal 72a to the terminal 72c, and the switched Hall output signal, Vo, is equal to $V_H+V_{op}$. During phase $\Phi_{90°}$, current flows from the terminal 72b to the terminal 72d, and the switched Hall output signal, Vo, is equal to $-V_H+V_{op}$. Thus, the modulation circuit 74 modulates the magnetic signal component to provide a modulated magnetic signal component, $V_H$, which is shown in FIG. 3C for a magnetic field other than zero. The offset component, $V_{op}$ remains substantially invariant as is shown in FIG. 3B.

Figure 5:
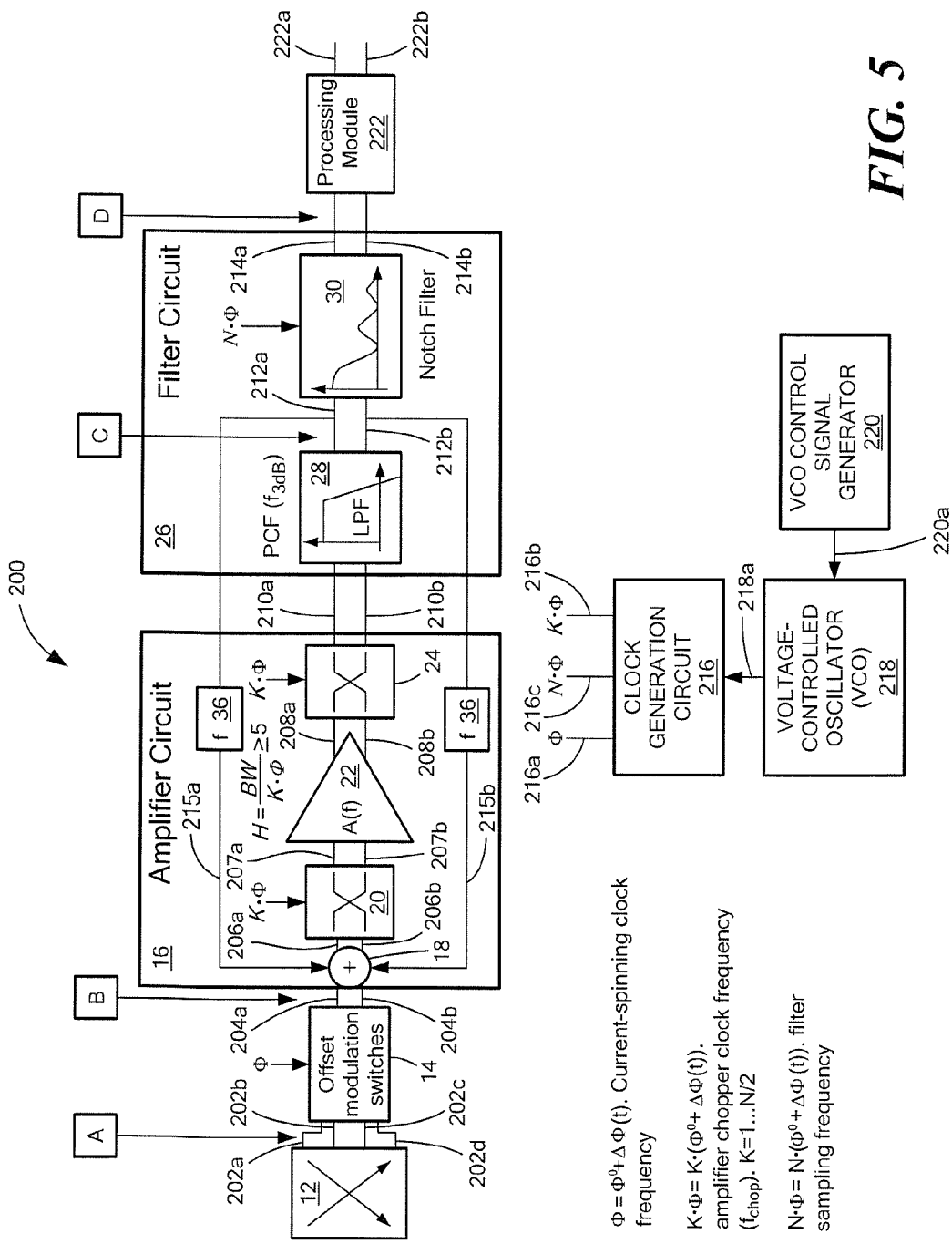
FIG. 5 is a block diagram showing a magnetic field sensor having a Hall element, a modulation circuit, an amplifier circuit having a chopper stabilized amplifier, and a filter circuit having an anti-alias filter and a discrete-time selective filter, for which clocked portions are clocked with clocks that vary in frequency in proportion to a modulating clock signal.
Figure 5A:
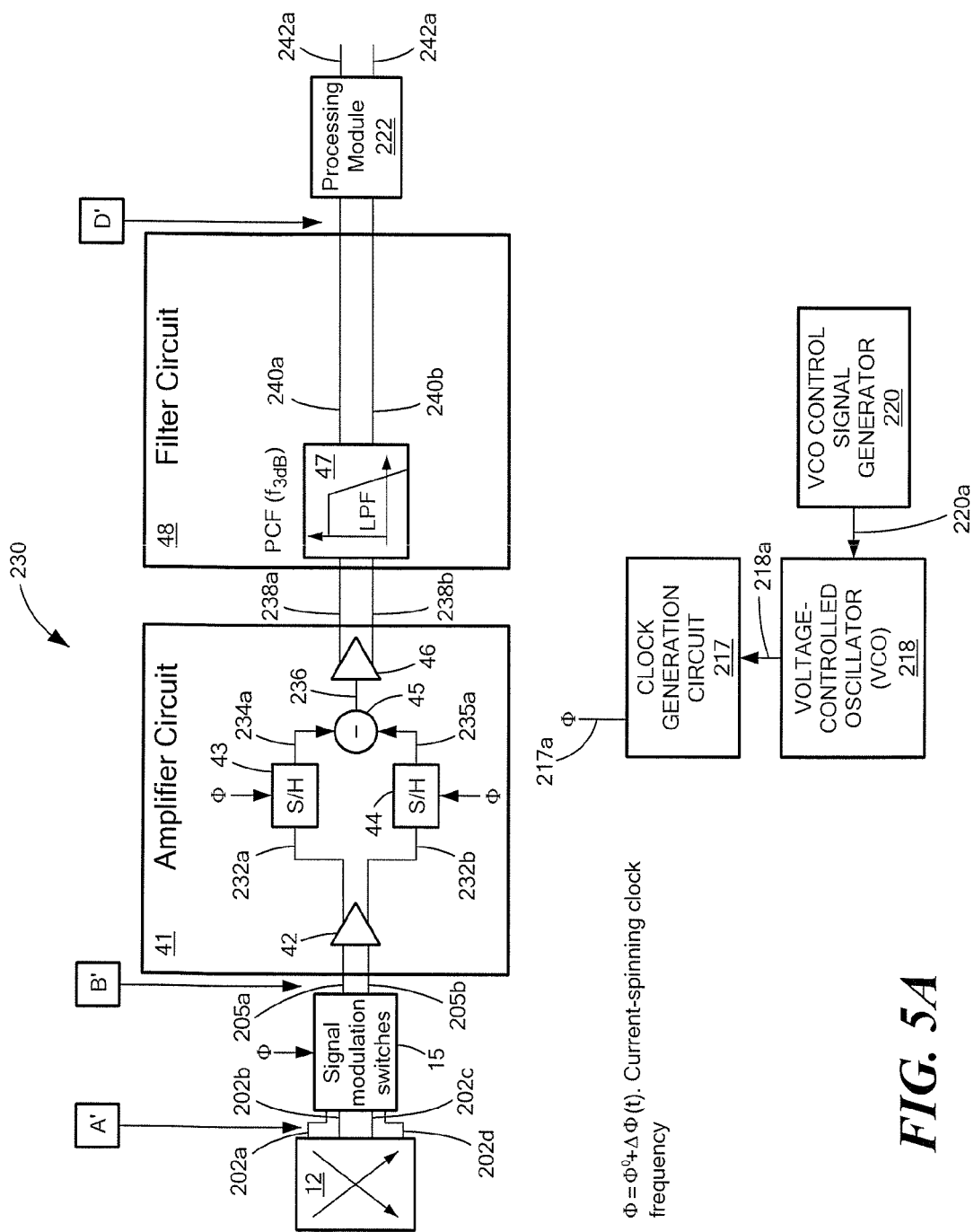
FIG. 5A is a block diagram showing another magnetic field sensor having a Hall element, a modulation circuit, an amplifier circuit having a sample and hold circuit, and a filter circuit having a low pass filter, for which clocked portions are clocked with clocks that vary in frequency in proportion to a modulating clock signal.

It will be understood from discussion below in conjunction with FIGS. 5 and 5A that, in a preferred embodiment, the modulation circuit 14 of FIG. 5 is of a type described above in conjunction with FIGS. 2-2C, and the modulation circuit 15 of FIG. 5A is of a type described above in conjunction with FIGS. 3-3C. In other words, in a preferred embodiment, the amplifier circuit 16 of FIG. 5 receives the differential signal 14a, 14b having a modulated offset component and an un-modulated magnetic field signal component. Conversely, in a preferred embodiment, the amplifier circuits 41 of FIG. 5A receives the differential signal 15a, 15b having a modulated magnetic field signal component and an un-modulated offset component.

Figure 4:
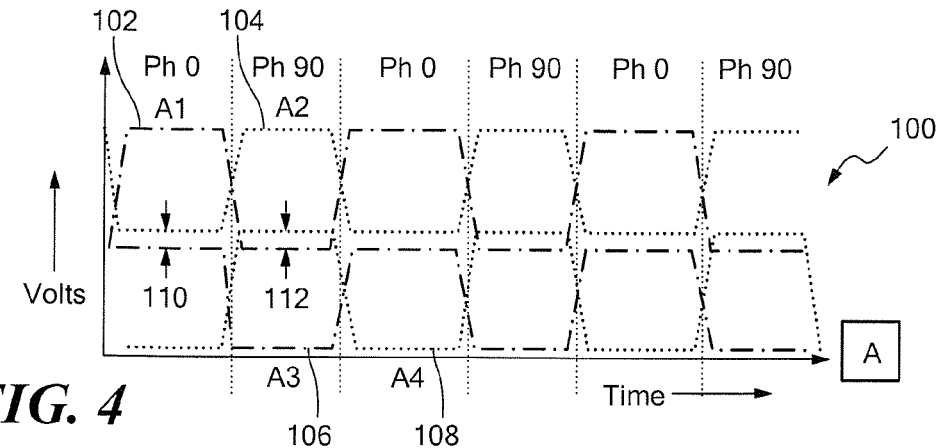
FIG. 4 is a graph showing four signals as single-ended signals appearing at a point A FIGS. 1 and 1A.
Figure 4A:
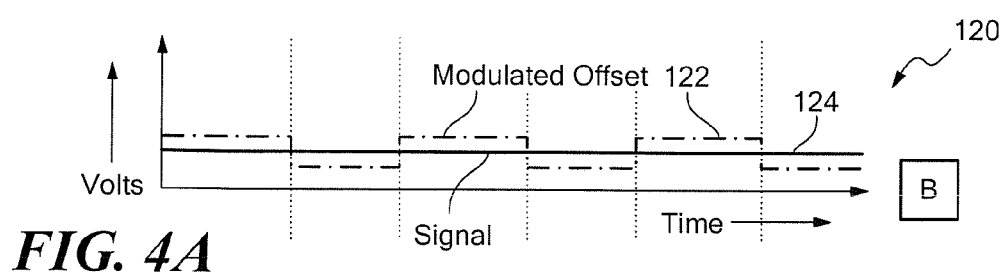
FIG. 4A is a graph showing a differential signal having a modulated offset component and an un-modulated signal component appearing at a point B of FIG. 1.
Figure 4B:
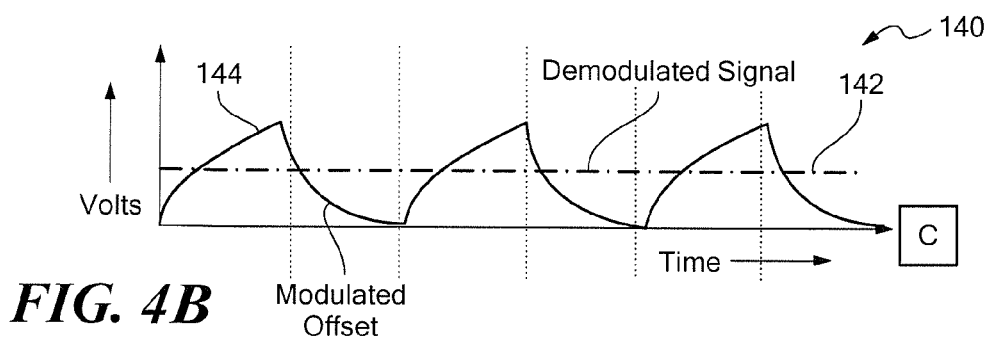
FIG. 4B is a graph showing a differential signal having a demodulated magnetic field signal component and a modulated offset component appearing at a point C of FIG. 1.
Figure 4C:
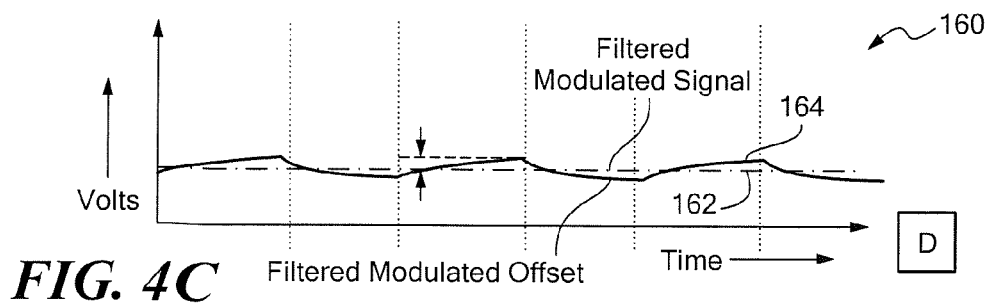
FIG. 4C is a graph showing a filtered differential signal having a demodulated signal component and a filtered modulated offset component appearing at a point D of FIGS. 1 and 1A.

Referring now to FIGS. 4-4C, graphs 100, 120, 140, 160 are indicative of signals appearing at points A, B, C, and D of FIG. 1. The graphs 100, 120, 140, 160 each have a horizontal axis with a scale in arbitrary units of time and a vertical axis with a scale in arbitrary units of volts.

Regarding the arrangement of FIG. 1A, signals labeled A', B' and D' in FIG. 1A are similar to signals A, B and D of FIGS.

1 and 4-4C. Operation of the magnetic field sensor 40 of FIG. 1A is described in the above-mentioned U.S. Pat. No. 5,621, 319, and is not further described herein.

The graph 100 includes four signals 102, 104, 106, 108, which are indicative of signals 12a, 12b, 12c, 12d, respectively, i.e., the signal A, shown in FIG. 1, and which are also indicative of the four signals received by the switches 56a, 56b, 56c, 56d of FIG. 2. In any half cycle of the clock signal, Φ, of FIG. 1 and signal, CLK, of FIG. 2, two of the signals (102 and 108 or 104 and 106) are present at the output of the modulation circuit as the signals $V_o+$ and $V_o-$ of FIG. 2, which are the differential signal 14a, 14b of FIG. 1, i.e., the signal B of FIG. 1. Differences between the signals $V_o+$ and $V_o-$ of FIG. 2 and between the signals 14a, 14b of FIG. 1 are differential signals.

During a phase, Ph 0, signals 104 and 106 differ by an amount 110. During a phase Ph 90, signals 108 and 102 differ by an amount 112, which is opposite in polarity from the difference of the signals 104 and 106. A signal 122 of FIG. 4A is representative of the above-described difference of signals, is also representative of a sum of the signals $V_{op}$ and $V_H$ of FIGS. 2B and 2C, and is also representative of a differential signal B of FIG. 1. The AC part of the signal 122 is representative of a modulated offset component of the signal 122. A line 124 is representative of a DC part (or low frequency part) of the signal 122, i.e., a magnetic field signal component of the signal 122, which is an un-modulated magnetic field signal component.

A signal 144 is representative of the differential signal 28a, 28b of FIG. 1, i.e., the signal C of FIG. 1. The signal 144 can have rounded edges due to band limiting effects of the low pass filter circuit 28 of FIG. 1, depending upon a frequency of the clock signal 32b of FIG. 1. The signal 144 is larger than the signal 122 due to amplification provided by the amplifier circuit 16 of FIG. 1. The signal 144 has an AC part representative the offset component 124 of FIG. 4A, and is a modulated offset component generated by way of the amplifier circuit 16 of FIG. 1 (a chopper-stabilized amplifier). A line 142 is representative of a DC part of the signal 144, and is a demodulated version of the AC part of the modulated magnetic field signal 122 (i.e., a magnetic field signal component).

It should be recognized that the desired signal (magnetic field signal component) is the DC part (or low frequency part) of the signal 144, which DC part is represented by the line 142, and the undesired signal (offset component) is the AC part of the signal 144. It should also be understood that the DC part of the signal 144 represented by the line 142 is only a DC signal when the magnetic field sensor 10 of FIG. 1 experiences a static magnetic field. In other words, if the magnetic field sensor 10 of FIG. 1 experiences a varying magnetic field, then the DC part of the signal 144 represented by the line 142 will have a varying (AC) part.

A curve 164 is representative of the differential signal 30a, 30b of FIG. 1, i.e., the signal D of FIG. 1. The curve 164 is a filtered version of the curve 144. It should be recognized that filtering the signal 144 to achieve the signal 164 removes much of the AC part of the signal 144, leaving a signal more closely representative of the desired DC part (magnetic field signal component) of the signal 144, of which lines 142 and 162 are representative. However, as described above, it should also be understood that the DC part of the signal 164 represented by the line 162 is only a DC signal when the magnetic field sensor 10 of FIG. 1 experiences a static magnetic field.

It should be understood that the signals of FIGS. 4, 4A, and 4C are similar to signals A', B' and D' of FIG. 1A. However, with respect to FIG. 1A, the signal 122 of FIG. 4A is representative of a sum of the signals $V_{op}$ and $V_H$ of FIGS. 3B and 3C, and is also representative of the differential signal B' of FIG. 1A. The AC part of the signal 122 is representative of a modulated magnetic field signal component of the signal 122. A line 124 is representative of a DC part (or low frequency part) of the signal 122, i.e., an offset component of the signal 122. Therefore, referring to FIG. 4A, for the signal B' of FIG. 1A, unlike the signal B of FIG. 1, it is the magnetic field signal that is modulated and not the offset component.

Referring now to FIG. 5, in which like elements of FIG. 1 are shown having like reference designations, a magnetic field sensor 200 is similar to the magnetic field sensor 10 of FIG. 1. However, the magnetic field sensor 200 includes a voltage controlled oscillator (VCO) 218 coupled to receive a VCO control signal 220a generated by a VCO control signal generator 220. The VCO 218 is configured to generate a VCO output signal 218a that varies in frequency in response to the VCO control signal 220a. A clock generation circuit 216 is coupled to receive the VCO output signal 218a and configured to generate clock signals 216a, 216b, 216c that also vary in frequency.

Similar to the clock generation circuit 32 of FIG. 1, the clock generation circuit 216 is configured to provide clock signals 216a, 216b, 216c to the modulation circuit 14, to the amplifier circuit 16, and to the filter circuit 26, respectively. Therefore, in preferred embodiments, switching function of the modulation circuit 14, switching function of the amplifier circuit 16, and switching function of the filter circuit 26 are synchronous.

Like in the magnetic field sensor 10 of FIG. 1, the modulation circuit 14 can be clocked with the clock signal 216a having a frequency, Φ. The first and second switching circuits 20, 24 can be clocked with the clock signal 216b having a frequency KΦ, where K is an integer times ½. The discrete time selective filter 30 can be clocked with the clock signal 216c having a frequency of NΦ. In some arrangements KΦ=½Φ and NΦ=¼Φ. However, unlike the magnetic field sensor 10 of FIG. 1, the clock signals 216a, 216b, 216c have non-static (varying) frequencies.

In particular, the clock signal 216a can be a first modulation signal having a first changing modulation frequency that changes between a first minimum frequency and a first maximum frequency. In some embodiments, the first changing modulation frequency changes from the first minimum frequency to the first maximum frequency in a linear sweep. In some other embodiments, the first changing modulation frequency changes from the first minimum frequency to the first maximum frequency in a non-linear sweep. In some other embodiments, the first changing modulation frequency changes from the first minimum frequency to the first maximum frequency in a plurality of discrete frequency steps. In some other embodiments, the first changing modulation frequency changes in a plurality of discrete frequency steps. In some embodiments, the discrete frequency steps are steps in a pseudorandom noise pattern.

Similarly, the clock signal 216b can be a second modulation signal having a second changing modulation frequency that changes between a second minimum frequency and a second maximum frequency. In some embodiments, the second changing modulation frequency is equal to and synchronous with the first changing modulation frequency of the first clock signal 216a. In some other embodiments, the second changing modulation frequency is different than but synchronous with the first changing modulation frequency of the first clock signal 216a.

Similarly, the clock signal 216c can be a sampling signal having a changing sampling frequency related to the first changing modulation frequency of the first clock signal 216a or to the second clock signal 217b, wherein the discrete time selective filter 30 has a changing notch frequency related to the first changing modulation frequency. In some embodiments, the changing sampling frequency is equal to an integer times the first changing modulation frequency of the first clock signal. In some embodiments, the changing sampling frequency is equal to the first changing modulation frequency. In some embodiments, the changing sampling frequency is equal to two times the first changing modulation frequency. In some embodiments, the changing notch frequency is equal to the first changing modulation frequency.

In some embodiments, the anti-aliasing filter 28 has a corner frequency selected to reduce frequency components above one half of a maximum sampling frequency associated with the changing sampling frequency.

Differential signals 204a-204b, 215a-215b, 206a-206b, 207a-207b, 208a-208b, 210a-210b, 212a-212b, and 214a-214b generally correspond to signals 14a-14b, 36a-36b, 18a-18b, 20a-20b, 22a-22b, 24a-24b, 28a-28b, and 30a-30b of FIG. 1, but are different due to the use of different clock signals 216a-216c. The differential signal (i.e., a differential signal properly selected from among the signals 204a-204d in pairs by means of the modulation circuit 14) can be the same as or similar to the differential signal (i.e., the differential signal properly selected from among the signals 12a-12d in pairs by means of the modulation circuit 14) of FIG. 1.

Referring now to FIG. 5A, in which like elements of FIGS. 1A and 5 are shown having like reference designations, a magnetic field sensor 230 is similar to the magnetic field sensor 40 of FIG. 1A. However, the magnetic field sensor 230 includes the voltage controlled oscillator (VCO) 218 coupled to receive the VCO control signal 220a generated by the VCO control signal generator 220. The VCO 218 is configured to generate the VCO output signal 218a that varies in frequency in response to the VCO control signal 220a. A clock generation circuit 217 is coupled to receive the VCO output signal 218a and configured to generate a clock signal 217a.

Similar to the clock generation circuit 49 of FIG. 1A, the clock generation circuit 217 is configured to provide a clock signal 217a to the modulation circuit 15 and to the amplifier circuit 41. Therefore, in preferred embodiments, switching function of the modulation circuit 15 is synchronous with switching function of the amplifier circuit 41. In some embodiments, the filter circuit 48 is not clocked. In other embodiments, the filter circuit 48 can include a discrete-time selective filter, which can be the same as or similar to the discrete-time selective filter 30 of FIG. 5, in which case another clock signal is provided to clock the discrete-time selective filter.

Similar to the clock signal 216a of FIG. 5, the clock signal 217a can be a modulation signal having a changing modulation frequency that changes between a minimum frequency and a maximum frequency. In some embodiments, the changing modulation frequency changes from the minimum frequency to the maximum frequency in a linear sweep. In some other embodiments, the changing modulation frequency changes from the minimum frequency to the maximum frequency in a non-linear sweep. In some other embodiments, the changing modulation frequency changes from the minimum frequency to the maximum frequency in a plurality of discrete frequency steps. In some other embodiments, the changing modulation frequency changes in a plurality of discrete frequency steps. In some embodiments, the discrete frequency steps are steps in a pseudorandom noise pattern.

Signals 205a-205b, 232a-232b, 234a, 235a, 236, 238a-238b, and 240a-240b generally correspond to signals 14a-14b, 42a-42, 43a, 44a, 45a, 46a-46b, and 47a-47b of FIG. 1A, but are different due to the use of a different clock signal 217a. Differential signal 202b, 202c can be the same as or similar to the differential signal 12b, 12c of FIG. 1A.

FIGS. 6-10 show examples of signals that occur during operation of the magnetic field sensor 200 of FIG. 5. Similar signals that occur during operation of the magnetic field sensor 230 of FIG. 5A will be understood but are not explicitly shown.

Figure 6:
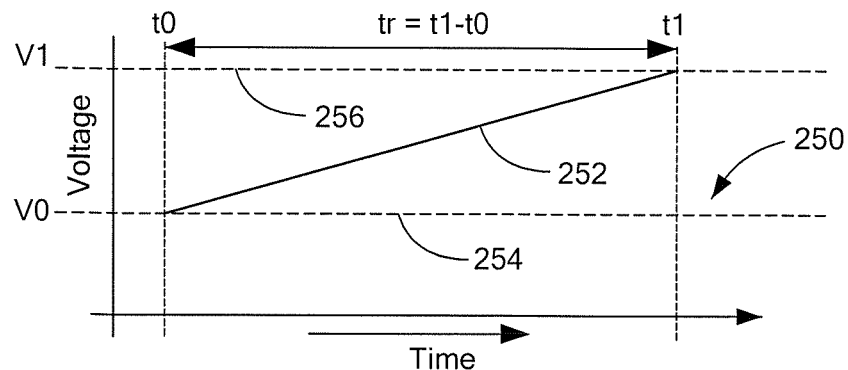
FIG. 6 is a graph showing a voltage ramp as may be provided as a control signal to a VCO of FIG. 5 or 5A.

Referring now to FIG. 6, a graph 250 has a horizontal axis with a scale in units of time in arbitrary units and a vertical axis with a scale in units of volts in arbitrary units. A curve 252 that sweeps from a minimum voltage 254 to a maximum voltage 256 is representative of one particular embodiment of the VCO control signal 220a of FIG. 5, corresponding to a linear sweep of the frequency of the clock signals 216a, 216b, 216c.

While the curve 252 is shown to ramp only upward with time, during another time period, the curve 252 can ramp downward, wherein the upward and downward ramps repeat periodically.

Figure 6A:
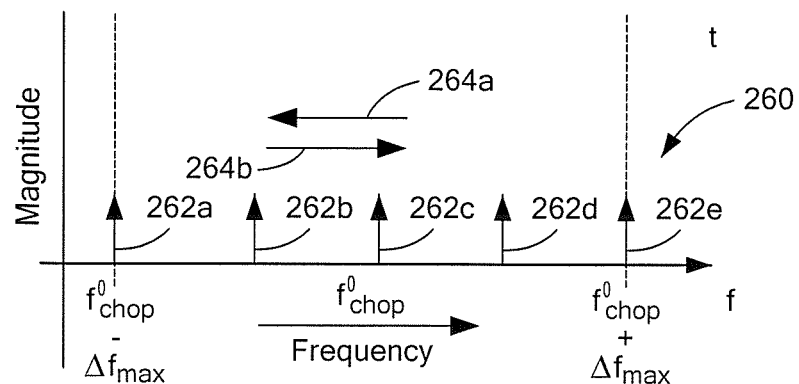
FIG. 6A is a frequency domain graph showing a varying frequency as may be generated as the modulating clock signal of FIG. 5 or 5A in response to the voltage ramp of FIG. 6.

Referring now to FIG. 6A, a graph 260 has a horizontal axis with a scale in unit of frequency in arbitrary units and a vertical axis with a scale in units of power in arbitrary units. The graph 260 is a frequency domain view, wherein lines 262a-262e represent a plurality of instantaneous snapshots of the clock signal 216a of FIG. 5 when the VCO control signal 220a is as shown in FIG. 6 for an upward sweep of the frequency, but which ramps downward (not shown) for a downward sweep of the frequency. Arrows 264a, 264b represent that the frequency of the clock signal 216a can sweep up then down in frequency between a minimum frequency $f^0{}_{chop}-\Delta f_{max}$ and $f^0{}_{chop}+\Delta f_{max}$, where a frequency, $f^0{}_{chop}$, a chopping frequency (modulation frequency) of the clock signal 216a is a center frequency at a center of the sweep range. In other arrangements, the frequency of the clock signal 216a sweeps periodically only up or only down in frequency, then rapidly resets to the other extreme value.

Figure 7:
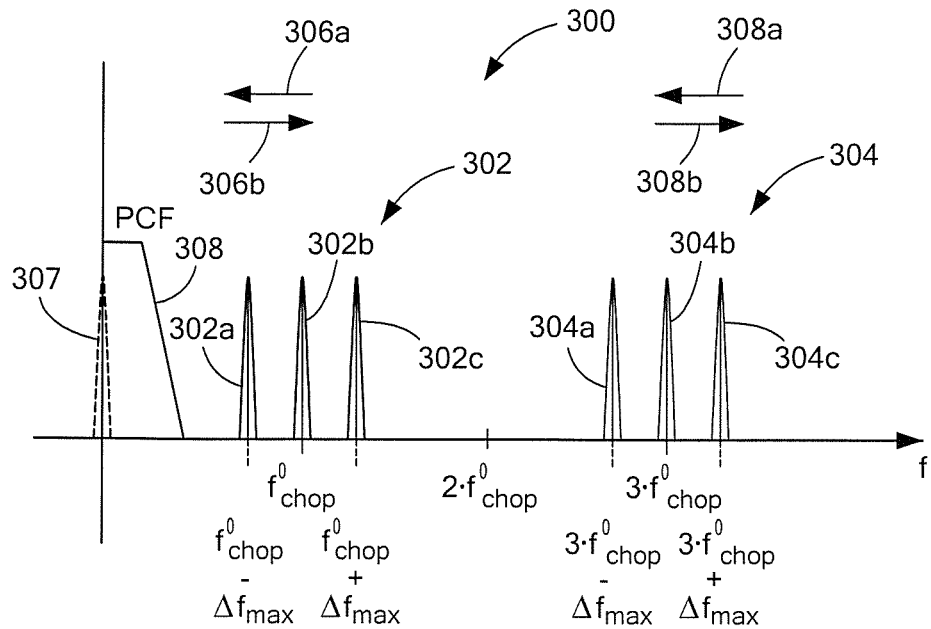
FIG. 7 is a frequency domain graph showing a modulated signal having a varying frequency and harmonics thereof as may be generated after a first switching circuit within the amplifier circuit of FIG. 5 or at the output of the modulation circuit of FIG. 5A and also showing a baseband (demodulated) signal as may be generated at the output of the amplifier circuit of FIG. 5 or 5A or at the output of the filter circuit of FIG. 5 or 5A.

Referring now to FIG. 7, a graph 300 has a horizontal axis with a scale in unit of frequency in arbitrary units and a vertical axis with a scale in units of power in arbitrary units. The graph 300 is a frequency domain view, wherein lines 302a-302c represent a plurality of instantaneous snapshots of a fundamental frequency of the magnetic field signal component of the differential signal 207a, 207b of FIG. 5 when the clock signal 216a is as shown in FIG. 6A for an upward sweep of the frequency, but which ramps downward (not shown) for the downward sweep of the frequency. A finite width of the lines 302a-302c is representative of the magnetic field signal component (i.e., a magnetic field sensed by the Hall element 12 of FIG. 5) having signal content not only at DC but also at relatively low frequencies. Arrows 306a, 306b represent that the frequency of the differential signal 207a, 207b can sweep up then down in frequency in a periodic fashion.

Lines 304a-304c represent a plurality of instantaneous snapshots of a third harmonic of the magnetic field signal component of the differential signal 207a, 207b of FIG. 5. It will be understood that the modulation circuit 14 of FIG. 5 (like the circuit of FIG. 2), is a circuit that multiplies the differential signal 202b, 202c of FIG. 5 by a square wave (clock signal 216a). Thus, a third harmonic (and other odd harmonics) of the sweeping frequency represented by the lines 302a-302c is generated. The lines 304a-304c are representative of only the third harmonic, but other odd harmonics are also generated by the modulation circuit 14.

In some arrangements, the center frequency, $f^0_{chop}$, is about three hundred kilohertz.

It will be understood that the lines 304a-304c are not shown in proper relative proportion to the lines 302a-302c, but would have power equal to ⅑ ((⅓)²) of the power of the lines 302a-302c.

A dashed line 307 (narrow spectrum) is representative of the magnetic field signal component of the differential signal 210a, 210b (FIG. 5) at the output of the amplifier circuit 16. In other words, the dashed line 307 is representative of the sweeping signal 302a-302c of FIG. 7 (i.e., differential signal 207a, 207b, which are representative of the magnetic field signal component) after it is demodulated back to baseband by operation of the amplifier circuit 16 (by the second switching circuit 24) when clocked by the sweeping clock signal 216b. The demodulation results in the line (narrowband) spectrum 307. The differential signal 210a, 210b represented by the dashed line 307 appears at or near DC and does not sweep in this example.

A curve 308 is representative of a pass band of the filter circuit 26.

Figure 8:
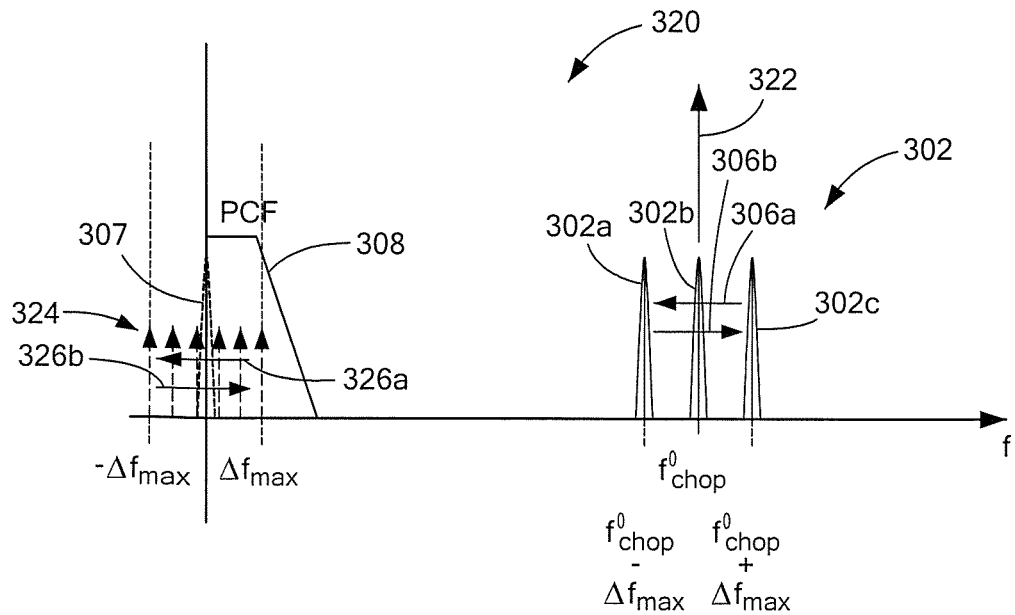
FIG. 8 is a frequency domain graph showing a modulated signal having a varying frequency (but omitting harmonics thereof) as may be generated after a first switching circuit within the amplifier circuit of FIG. 5 or at the output of the modulation circuit of FIG. 5A, also showing a noise signal as may occur in the band of the modulated signal, also showing a baseband (demodulated) signal as may be generated at the output of the amplifier circuit of FIG. 5 or 5A or at the output of the filter circuit of FIG. 5 or 5A, and also showing the noise signal demodulated to baseband as also may be generated at the output of the amplifier circuit of FIG. 5 or 5A or at the output of the filter circuit of FIG. 5 or 5A.

Referring now to FIG. 8, in which like elements of FIG. 7 are shown having like reference designations, a graph 320 has a horizontal axis with a scale in units of frequency in arbitrary units and a vertical axis with a scale in units of power in arbitrary units. The graph 320 is a frequency domain view, wherein the lines 302a-302c again represent a plurality of instantaneous snapshots of the fundamental frequency of the magnetic field signal component of the differential signal 207a, 207b of FIG. 5 when the clock signal 216a is as shown in FIG. 6A for an upward sweep of the frequency, but which ramps downward (not shown) for the downward sweep of the frequency. The third harmonics 304a-304c of FIG. 7 are not shown.

A line (frequency) 322 is representative of a noise, which may be, for example, a magnetic field noise, as may be sensed by the Hall element 12 of FIG. 5, or which may be, for another example, an electrical noise, as may be coupled to the Hall element 12, to the modulation circuit 14, or to the amplifier circuit 16 of FIG. 5 before the switching circuit 24 (note: if injected after the switching circuit 24, the noise will not be modulated back to baseband). The exemplary noise signal 322 is stationary in frequency.

In some arrangements, the center frequency, $f^0_{chop}$, is about three hundred kilohertz and the noise signal 322 has a static or nearly static frequency of about three hundred kilohertz. However, from discussion below in conjunction with FIG. 9B, it will be appreciated that the magnetic field sensor 200 of FIG. 5 (and 230 of FIG. 5A) also offer advantages for noise signals at frequencies other than at the center frequency, $f^0_{chop}$, and also for noise signals that are not stationary in frequency. Nevertheless, the example shown in FIG. 8, wherein the noise signal 322 at the same frequency as the center frequency, $f^0_{chop}$, is shown for clarity.

A group of lines 324 is representative of the spectral line 322 when demodulated by operation of the amplifier circuit 16 of FIG. 5 (i.e., within differential signal 210a, 210b or 212a, 212b of FIG. 5) when the frequency of the clock signals 216a-216c sweeps in frequency according to FIG. 6A.

Since the noise, i.e. the spectral line 322, is stationary in frequency, when demodulated with the clock signal 216b, which sweeps in frequency, the result is a baseband signal that sweeps in frequency, of which the group of lines 324 is representative. It will also be appreciated that, if a stationary clock were used (as in FIG. 1) for the demodulation by the amplifier circuit 16 instead of the sweeping clock 216b, the demodulated noise signal might appear at or near DC, and would combine with the desired demodulated signal 307 (magnetic field signal component). The combination would reduce the accuracy of the desired demodulated signal 307.

FIGS. 9-9B below show exemplary signals that appear during operation of the magnetic field sensor 200 of FIG. 5 when the clock signal 216a has a frequency that changes linearly up and down between a minimum frequency and a maximum frequency as described above in conjunction with FIGS. 6 and 6A. In contrast, FIGS. 10-10B below show signals that appear during operation of the magnetic field sensor 200 of FIG. 5 when the clock signal 216a has a frequency that changes up and down between a minimum frequency and a maximum frequency in a plurality of discrete frequency steps. Other embodiments are described above in conjunction with FIG. 5, but other exemplary signals are not explicitly shown herein.

Referring now to FIG. 9, a graph 340 has a horizontal axis with a scale in units of time in microseconds and a vertical axis with a scale in units of frequency in Hz. A waveform 342 is representative of a frequency of the clock signal 216a of FIG. 5, which ramps up, and then, in some embodiments, which ramps down (down not shown). Clocks 216b and 216c sweep up and down accordingly.

Referring now to FIG. 9A, a graph 360 has a horizontal axis with a scale in units of time in microseconds and a vertical axis with a scale in units of volts in millivolts. A signal 362 is representative of the differential signal 212a, 212b of FIG. 5 when the magnetic field sensor 200 of FIG. 5 has been subjected to noise, e.g., noise 322 of FIG. 8, which is static in frequency. Thus, the signal 362 is also representative of a signal sweeping in frequency represented by the group of lines 324 of FIG. 8. As described above in conjunction with FIG. 8, the signal 362 is representative of the noise signal 322 of FIG. 8 having been demodulated by the amplifier circuit 16 of FIG. 5 (by the second switching circuit 24) down to baseband, but which sweeps in frequency due to operation of the sweeping clock signals 216a-216c.

In the signal 362, a high frequency component can be seen riding upon the lower frequency sinusoid. The high frequency component is representative of the offset component of the differential signal generated by the Hall element, which has been shifted in frequency to a higher frequency by operation of the modulation circuit 14 and the amplifier circuit 16 of FIG. 5.

Referring now to FIG. 9B, a graph 380 has a horizontal axis with a scale in units of time in microseconds and a vertical axis with a scale in units of volts in millivolts. A signal 382 is representative of the differential signal 214a, 214b of FIG. 5, also when the magnetic field sensor 200 of FIG. 5 has been subjected to noise, e.g., noise 322 of FIG. 8, which is static in frequency. The signal 382 is similar to the signal 362 of FIG. 9A, but has passed through the discrete-time selective filter 30 of FIG. 5. The high frequency component of the signal 362 of FIG. 9A has been removed by operation of the filter circuit 26 of FIG. 5. Samples steps can be seen in the signal 382, which result from the discrete sampling of the discrete-time selective filter 30, and which could be removed with an additional filter (not shown) if desired.

While the signals 362, 382 contain noise that appears as a signal that sweeps in frequency, it will be appreciated that a desired signal, i.e., a magnetic field signal component of the differential signal 202b, 202c generated by the Hall element 12, is the DC part of the signals 362, 382 for the case when the magnetic field signal component of the differential signal 202b, 202c is at DC. The DC part is shown to be zero volts, but could be another value proportional to a magnetic field experienced by the Hall element 12.

It will also be appreciated that, if the clock signals 216a-216c of FIG. 5 had static frequencies, like the clock signals 32a-32c of FIG. 1, then the static noise signal 322 of FIG. 8, when demodulated (by the second switching circuit 24 of FIG. 5), would not sweep in frequency according to the group of lines 324 of FIG. 8, but would be at one frequency, which could be at DC, or which could be close to DC (slowly varying), thus resulting in an inaccuracy in the resulting detected magnetic field signal component of the signal 214a, 214b of FIG. 5. However, since the sweeping clock signals 216a-216c result in a noise signal that sweeps in frequency, the noise signal is easily identified and can be removed by subsequent processing or by subsequent filtering leaving only the desired magnetic field signal component.

The subsequent processing or filtering can be provided as a processing module 222 shown in FIGS. 5 and 5A, which is coupled to receive the differential signal 214a, 214b or 240a, 240b of FIG. 5 or 5A, respectively. In some embodiments, the processing module 222 can be a simple low pass filter. In other embodiments, the processing module 222 can include another discrete time selective filter. In some embodiments, the processing module 222 can include a digital filter. In some embodiments, the processing module 222 can include logic that can a) select a stable time region of the differential signal 214a, 214b or 240a, 240b, and b) calculate a DC value (or slowly varying value) of the differential signal to identify the magnetic field signal component.

The above differentiation of the magnetic field signal component from the noise signal remains true even for a magnetic field signal component of the differential signal (i.e., a differential signal properly selected from among signals 202a-202d in pairs by means of the modulation circuit 14) that relatively slowly varies in frequency, so long as the varying noise signal does not dwell at the frequency (including DC) of the magnetic field signal component. The above differentiation of the magnetic field signal component from the noise signal also remains true even for a magnetic field signal component of the differential signal (i.e., the differential signal properly selected in pairs from among the signals 202a-202d) by means of the modulation circuit 14) that relatively varies in frequency, and the noise signal also varies in frequency, so long as the varying frequency of the noise signal does not dwell at the frequency of the varying frequency of the magnetic field signal component.

Referring now to FIG. 10, a graph 400 has a horizontal axis with a scale in units of time in microseconds and a vertical axis with a scale in frequency in units of Hz. A waveform 402 is representative of the frequency of the clock signal 216a of FIG. 5, which takes discrete steps up, and then, in some embodiments, which takes discrete steps down. Clocks 216b and 216c step up and down accordingly in discrete frequency steps.

Referring now to FIG. 10A, a graph 420 has a horizontal axis with a scale in units of time in microseconds and a vertical axis with a scale in units of volts in millivolts. A signal 422 is representative of the differential signal 212a, 212b of FIG. 5 when the magnetic field sensor 200 of FIG. 5 has been subjected to noise, e.g., the noise signal 322 of FIG. 8, which is static in frequency. Thus, the signal 422 is also representative of a signal stepping in frequency, which can also be represented by the group of lines 324 of FIG. 8. As described above in conjunction with FIG. 8, the signal 422 is representative of the noise signal 322 of FIG. 8 having been demodulated by the amplifier circuit 16 of FIG. 5 down to baseband, but which steps in frequency due to operation of the frequency stepping clock signals 216a-216c.

In the signal 422, a high frequency component can be seen riding on the lower frequency stepped signal. This component represents the offset component of the differential signal 202b, 202c generated by the Hall element 12, which has been shifted in frequency to a higher frequency by operation of the modulation circuit 14 and the amplifier circuit 16 of FIG. 5.

Referring now to FIG. 10B, a graph 440 has a horizontal axis with a scale in units of time in microseconds and a vertical axis with a scale in units of volts in millivolts. A signal 442 is representative of the differential signal 214a, 214b of FIG. 5 also when the magnetic field sensor 200 of FIG. 5 has been subjected to noise, e.g., noise 322 of FIG. 8, which is static in frequency. The signal 442 is similar to the signal 422 of FIG. 10A, but has passed through the discrete-time selective filter 30 of FIG. 5. The high frequency component of the signal 422 of FIG. 10A has been removed by operation of the filter circuit 26 of FIG. 5. Sample steps can be seen in the signal 442, which could be removed with an additional filter (not shown) if desired.

Discussion above in conjunction with FIG. 9B regarding differentiation of the magnetic field signal component from the noise signal is substantially the same in regard to FIGS. 10-10B and is not repeated here.

As described above, other clock signals 216a-216c can provide other types of modulations, but all result in the same ability to differentiate the magnetic field signal component from the noise signal, while substantially removing the offset component.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
   a Hall element configured to generate a Hall element output signal in response to a magnetic field, the Hall element output signal comprising a magnetic field signal component and an offset signal component; and
   a Hall element modulation circuit coupled to receive the Hall element output signal and configured to generate a modulation circuit output signal, wherein the Hall element modulation circuit is operable to modulate the magnetic signal component or the offset signal component with a first modulation signal having a first changing modulation frequency that changes from a first minimum frequency to a first maximum frequency in a continuous frequency sweep, wherein the continuous frequency sweep is continuous in frequency.

2. The magnetic field sensor of claim 1, wherein the continuous frequency sweep comprises a linear frequency sweep.

3. The magnetic field sensor of claim 1, wherein the continuous frequency sweep comprises a non-linear frequency sweep.

4. The magnetic field sensor of claim 1, further comprising an amplifier circuit coupled to receive the modulation circuit output signal and configured to generate an amplifier circuit output signal.

5. The magnetic field sensor of claim 4, wherein the amplifier circuit comprises a switching circuit configured to modulate a signal representative of the modulation circuit output signal with a second modulation signal having a second changing modulation frequency that changes between a second minimum frequency and a second maximum frequency in a second continuous frequency sweep.

6. The magnetic field sensor of claim 5, wherein the second changing modulation frequency is equal to and synchronous with the first changing modulation frequency.

7. The magnetic field sensor of claim 6, wherein the second changing modulation frequency is different than but synchronous with the first changing modulation frequency.

8. The magnetic field sensor of claim 7, wherein the amplifier circuit comprises a sample and hold circuit configured to sample a signal representative of the modulation circuit output signal at a rate corresponding to a second modulation signal having a second changing modulation frequency that changes between a second minimum frequency and a second maximum frequency in a second continuous frequency sweep.

9. The magnetic field sensor of claim 8, wherein the second changing modulation frequency is equal to and synchronous with the first changing modulation frequency.

10. The magnetic field sensor of claim 4, further comprising a filter circuit coupled to receive the amplifier circuit output signal and configured to generate a magnetic field sensor output signal, wherein the filter circuit comprises:
   an anti-alias filter configured to generate an anti-aliased signal; and
   a discrete time selective filter coupled to the anti-aliasing filter, and configured to sample a signal representative of the anti-aliased signal in accordance with a sampling signal having a changing sampling frequency related to the first changing modulation frequency, wherein the discrete time selective filter has a changing notch frequency related to the first changing modulation frequency.

11. The magnetic field sensor of claim 10, wherein the and-aliasing filter has a corner frequency selected to reduce frequency components above one half of a maximum sampling frequency associated with the changing sampling frequency.

12. The magnetic field sensor of claim 10, wherein the changing sampling frequency is equal to an integer times the first changing modulation frequency.

13. The magnetic field sensor of claim 10, wherein the changing sampling frequency is equal to the first changing modulation frequency.

14. The magnetic field sensor of claim 10, wherein the changing sampling frequency is equal to two times the first changing modulation frequency.

15. The magnetic field sensor of claim 10, wherein the changing notch frequency is equal to the first changing modulation frequency.

16. The magnetic field sensor of claim 10, further comprising a voltage controlled oscillator configured to generate a voltage controlled oscillator output signal having a changing frequency related to the first changing modulation frequency.

17. The magnetic field sensor of claim 16, further comprising a clock generation circuit coupled to receive the voltage controlled oscillator output signal, and configured to generate at least one of the first modulation signal, the second modulation signal, or the sampling signal.

18. The magnetic field sensor of claim 16, further comprising a signal generator circuit configured to generate an output signal to control the changing frequency of the voltage controlled oscillator output signal.

19. The magnetic field sensor of claim 18, wherein the output signal of the signal generator comprises a linear voltage signal that ramps from a minimum voltage value to a maximum voltage value.

20. A magnetic field sensor, comprising:
   a Hall element configured to generate a Hall element output signal in response to a magnetic field, the Hall element output signal comprising a magnetic field signal component and an offset signal component; and
   a Hall element modulation circuit coupled to receive the Hall element output signal and configured to generate a modulation circuit output signal, wherein the Hall element modulation circuit is operable to modulate the offset signal component with a first modulation signal having a first changing modulation frequency that changes from a first minimum frequency to a first maximum frequency, and to at least one frequency between the first minimum frequency and the first maximum frequency, wherein the modulation of the offset signal component results in the offset signal component being shifted to a higher frequency and the magnetic field signal component remaining at baseband.

21. The magnetic field sensor of claim 20, wherein the first changing modulation frequency changes from the first minimum frequency to the first maximum frequency in a linear frequency sweep.

22. The magnetic field sensor of claim 20, wherein the first changing modulation frequency changes from the first minimum frequency to the first maximum frequency in a non-linear frequency sweep.

23. The magnetic field sensor of claim 20, wherein the first changing modulation frequency changes from the first minimum frequency to the first maximum frequency in more than two discrete frequency steps.

24. The magnetic field sensor of claim 20, wherein the first changing modulation frequency changes in a plurality of discrete frequency steps.

25. The magnetic field sensor of claim 20, further comprising an amplifier circuit coupled to receive the modulation circuit output signal and configured to generate an amplifier circuit output signal.

26. The magnetic field sensor of claim 25, wherein the amplifier circuit comprises a switching circuit configured to modulate a signal representative of the modulation circuit output signal with a second modulation signal having a second changing modulation frequency that changes from a second minimum frequency to a second maximum frequency, and to at least one frequency between the second minimum frequency and the second maximum frequency.

27. The magnetic field sensor of claim 26, wherein the second changing modulation frequency is equal to and synchronous with the first changing modulation frequency.

28. The magnetic field sensor of claim 26, wherein the second changing modulation frequency is different than but synchronous with the first changing modulation frequency.

29. The magnetic field sensor of claim 25, wherein the amplifier circuit comprises a sample and hold circuit configured to sample a signal representative of the modulation circuit output signal at a rate corresponding to a second modulation signal having a second changing modulation frequency that changes from a second minimum frequency to a second maximum frequency, and to at least one frequency between the second minimum frequency and the second maximum frequency.

30. The magnetic field sensor of claim 29, wherein the second changing modulation frequency is equal to and synchronous with the first changing modulation frequency.

31. The magnetic field sensor of claim 25, further comprising a filter circuit coupled to receive the amplifier circuit output signal. and configured to generate a magnetic field sensor output signal, wherein the filter circuit comprises:
   an anti-alias filter configured to generate an anti-aliased signal; and
   a discrete time selective filter coupled to the anti-aliasing filter, and configured to sample a signal representative of the anti-aliased signal in accordance with a sampling signal having a changing sampling frequency related to the first changing modulation frequency, wherein the discrete time selective filter has a changing notch frequency related to the first changing modulation frequency.

32. The magnetic field sensor of claim 31, wherein the anti-aliasing filter has a corner frequency selected to reduce frequency components above one half of a maximum sampling frequency associated with the changing sampling frequency.

33. A magnetic field sensor, comprising:
   a Hall element configured to generate a Hall element output signal in response to a magnetic field, wherein the Hall element output signal comprises a magnetic field signal component and an offset signal component, and wherein the Hall element output signal is within a baseband frequency band; and
   a Hall element modulation circuit coupled to receive the Hall element output signal and configured to generate a modulation circuit output signal, wherein the Hall element modulation circuit is operable to modulate the magnetic signal component or the offset signal component with a first modulation signal having a first changing modulation frequency that changes from a first minimum frequency to a first maximum frequency, and to at least one frequency between the first minimum frequency and the first maximum frequency, and wherein a repetition frequency of the changing modulation frequency is selected to be above the baseband frequency band of the Hall element output signal.

34. The magnetic field sensor of claim 33, wherein the first changing modulation frequency changes from the first minimum frequency to the first maximum frequency in a linear frequency sweep.

35. The magnetic field sensor of claim 33, wherein the first changing modulation frequency changes from the first minimum frequency to the first maximum frequency in a non-linear frequency sweep.

36. The magnetic field sensor of claim 33, wherein the first changing modulation frequency changes from the first minimum frequency to the first maximum frequency in more than two discrete frequency steps.

37. The magnetic field sensor of claim 33, wherein the first changing modulation frequency changes in a plurality of discrete frequency steps.

38. The magnetic field sensor of claim 33, further comprising an amplifier circuit coupled to receive the modulation circuit output signal and configured to generate an amplifier circuit output signal.

39. The magnetic field sensor of claim 38, wherein the amplifier circuit comprises a switching circuit configured to modulate a signal representative of the modulation circuit output signal with a second modulation signal having a second changing modulation frequency that changes from a second minimum frequency to a second maximum frequency, and to at least one frequency between the second minimum frequency and the second maximum frequency.

40. The magnetic field sensor of claim 39, wherein the second changing modulation frequency is equal to and synchronous with the first Changing modulation frequency.

41. The magnetic field sensor of claim 39, wherein the second changing modulation frequency is different than but synchronous with the first changing modulation frequency.

42. The magnetic field sensor of claim 38, wherein the amplifier circuit comprises a sample and hold circuit configured to sample a signal representative of the modulation circuit output signal at a rate corresponding to a second modulation signal having a second changing modulation frequency that changes from a second minimum frequency to a second maximum frequency, and to at least one frequency between the second minimum frequency and the second maximum frequency.

43. The magnetic field sensor of claim 42, wherein the second changing modulation frequency is equal to and synchronous with the first changing modulation frequency.

44. The magnetic field sensor of claim 38, further comprising a filter circuit coupled to receive the amplifier circuit output signal and configured to generate a magnetic field sensor output signal, wherein the filter circuit comprises:
   an anti-alias filter configured to generate an anti-aliased signal; and
   a discrete time selective filter coupled to the anti-aliasing filter, and configured to sample a signal representative of the anti-aliased signal in accordance with a sampling signal having a changing sampling frequency related to the first changing modulation frequency, wherein the discrete time selective filter has a changing notch frequency related to the first changing modulation frequency.

45. The magnetic field sensor of claim 44, wherein the anti-aliasing filter has a corner frequency selected to reduce frequency components above one half of a maximum sampling frequency associated with the changing sampling frequency.

* * * * *

UNITED STATES PATENT AND TRADEMARK OFFICE
CERTIFICATE OF CORRECTION

PATENT NO. : 8,564,285 B2  
APPLICATION NO. : 12/845115  
DATED : October 22, 2013  
INVENTOR(S) : Hernan D. Romero et al.

It is certified that error appears in the above-identified patent and that said Letters Patent is hereby corrected as shown below:

In the specification

Column 6, line 30 delete "in conjunction with in conjunction with" and replace with --in conjunction with--.

Column 7, line 43 delete "can further reduces" and replace with --can further reduce--.

Column 8, line 8 delete "magnetic filed" and replace with --magnetic field--.

Column 11, line 4 delete "signal 2176b" and replace with --signal 216b--.

Column 17, line 8 delete "claim 6," and replace with --claim 5,--.

Column 17, line 11 delete "claim 7," and replace with --claim 4,--.

Column 18, line 11 delete "Ha11" and replace with --Hall--.

Signed and Sealed this  
Twentieth Day of October, 2015

Michelle K. Lee  
*Director of the United States Patent and Trademark Office*